(12) United States Patent
Hara et al.

(10) Patent No.: US 8,472,149 B2
(45) Date of Patent: Jun. 25, 2013

(54) CPP TYPE MAGNETO-RESISTIVE EFFECT DEVICE AND MAGNETIC DISK SYSTEM

(75) Inventors: Shinji Hara, Tokyo (JP); Daisuke Miyauchi, Tokyo (JP); Koji Shimazawa, Tokyo (JP); Yoshihiro Tsuchiya, Tokyo (JP); Tomohito Mizuno, Tokyo (JP); Takahiko Machita, Tokyo (JP)

(73) Assignee: TDK Corporation, Tokyo (JP)

( * ) Notice: Subject to any disclaimer, the term of this patent is extended or adjusted under 35 U.S.C. 154(b) by 1438 days.

(21) Appl. No.: 11/865,384

(22) Filed: Oct. 1, 2007

(65) Prior Publication Data
US 2009/0086383 A1 Apr. 2, 2009

(51) Int. Cl.
*G11B 5/33* (2006.01)
(52) U.S. Cl.
USPC .......................................... 360/324; 360/324.1
(58) Field of Classification Search
USPC .............................................. 360/324, 324.1
See application file for complete search history.

(56) References Cited

U.S. PATENT DOCUMENTS

| | | | |
|---|---|---|---|
| 6,710,987 B2* | 3/2004 | Sun et al. | 360/324.2 |
| 6,798,626 B2* | 9/2004 | Hayashi et al. | 360/324.2 |
| 2003/0011945 A1 | 1/2003 | Yuasa et al. | |
| 2003/0086216 A1* | 5/2003 | Kagami et al. | 360/324.2 |
| 2004/0021990 A1* | 2/2004 | Koui et al. | 360/324.1 |
| 2005/0068691 A1* | 3/2005 | Kagami et al. | 360/324.2 |
| 2005/0135004 A1* | 6/2005 | Lee et al. | 360/122 |
| 2006/0262460 A1* | 11/2006 | Ide et al. | 360/324.12 |
| 2006/0279881 A1* | 12/2006 | Sato | 360/324.12 |
| 2007/0047159 A1* | 3/2007 | Zhao et al. | 360/324.12 |
| 2007/0054450 A1* | 3/2007 | Hong et al. | 438/257 |

FOREIGN PATENT DOCUMENTS

| | | |
|---|---|---|
| JP | 2000132815 A | 5/2000 |
| JP | 2001034915 A | 2/2001 |
| JP | 2002100011 A | 4/2002 |
| JP | 2003008102 A | 1/2003 |
| JP | 2003298143 A | 10/2003 |

OTHER PUBLICATIONS

U.S. Appl. No. 11/870,097, filed Oct. 10, 2007, Shimazawa, et al.

(Continued)

*Primary Examiner* — Hoa T Nguyen
*Assistant Examiner* — Carlos E Garcia
(74) *Attorney, Agent, or Firm* — Oblon, Spivak, McClelland, Maier & Neustadt, L.L.P.

(57) ABSTRACT

The invention provides a giant magneto-resistive effect device of the CPP (current perpendicular to plane) structure (CPP-GMR device) comprising a spacer layer, and a first ferromagnetic layer and a second ferromagnetic layer stacked together with said spacer layer sandwiched between them, with a sense current passed in the stacking direction, wherein the first ferromagnetic layer and the second ferromagnetic layer function such that the angle made between the directions of magnetizations of both layers change relatively depending on an external magnetic field, said spacer layer contains a semiconductor oxide layer, and a nitrogen element-interface protective layer is provided at a position where the semiconductor oxide layer forming the whole or a part of said spacer layer contacts an insulating layer. Thus, there is a nitride of high covalent bonding capability formed at the surface of junction between the semiconductor oxide layer and the interface protective layer, so that the migration of oxygen from the semiconductor oxide layer to the insulating layer is inhibited; even when the device undergoes heat and stress in the process, fluctuations and deteriorations of device characteristics are held back.

13 Claims, 17 Drawing Sheets

OTHER PUBLICATIONS

U.S. Appl. No. 11/931,219, filed Oct. 31, 2007, Shimazawa, et al.
U.S. Appl. No. 11/934,979, filed Nov. 5, 2007, Mizuno, et al.
U.S. Appl. No. 11/943,171, filed Nov. 20, 2007, Hara, et al.
U.S. Appl. No. 11/968,911, filed Jan. 3, 2008, Tsuchiya, et al.
U.S. Appl. No. 12/128,352, filed May 28, 2008, Mizuno, et al.
U.S. Appl. No. 12/112,598, filed Apr. 30, 2008, Hara, et al.
U.S. Appl. No. 11/768,435, filed Jun. 26, 2007, Tsuchiya, et al.
U.S. Appl. No. 11/626,562, filed Jan. 24, 2007, Hara, et al.

* cited by examiner

CPP TYPE MAGNETO-RESISTIVE EFFECT DEVICE AND MAGNETIC DISK SYSTEM

BACKGROUND OF THE INVENTION

1. Field of the Invention

The present invention relates to a magneto-resistive effect device for reading the magnetic field strength of a magnetic recording medium or the like as signals, a thin-film magnetic head comprising that magneto-resistive effective device, and a head gimbal assembly and a magnetic disk system comprising that thin-film magnetic head.

2. Explanation of the Prior Art

With recent improvements in the plane recording density of magnetic disk systems, there has been growing demands for improvements in the performance of thin-film magnetic heads. For the thin-film magnetic head, a composite type thin-film magnetic head has been widely used, which has a structure wherein a reproducing head having a read-only magneto-resistive effect device (hereinafter often referred to as the MR (magneto-resistive) device for short) and a recording head having a write-only induction type magnetic device are stacked on a substrate.

For the MR device, there is the mention of an AMR device harnessing an anisotropic magneto-resistive effect, a GMR device tapping a giant magneto-resistive effect, a TMR device making use of a tunnel-type magneto-resistive effect, and so on.

The reproducing head is required to have high sensitivity and high outputs in particular. GMR heads using a spin valve type GMR device have already been mass-produced as a reproduction head possessing such performances, and to meet further improvements in plane recording densities, reproducing heads using TMR devices are now being mass-produced, too.

In general, the spin valve type GMR device comprises a nonmagnetic layer, a free layer formed on one surface of that nonmagnetic layer, a fixed magnetization layer formed on another surface of the nonmagnetic layer, and a pinning layer (generally an antiferromagnetic layer) on the side of the fixed magnetization layer facing away from the non-magnetic layer. The free layer has its magnetization direction changing depending on an external signal magnetic field, and the fixed magnetization layer has its magnetization direction fixed by a magnetic field from the pinning layer (antiferromagnetic layer).

Incidentally, common GMR heads used so far in the art have a CIP (current in plane) structure wherein a current for detecting magnetic signals (the so-called sense current) is passed parallel with the plane of each of the layers forming the GMR device (CIP-GMR device). On the other hand, GMR devices having the so-called CPP (current perpendicular to plane) structure wherein the sense current is passed perpendicularly to the plane of each of the layers forming the GMR device (CPP-SMG device), too, are now under development as next-generation ones.

The aforesaid TMR devices, too, would come under the CPP structure category according to a classification system from the current-passing direction alone. However, the multilayer construction and detection principle of the TMR device are different from those of the CPP-GMR device. That is, the TMR device generally comprises a free layer, a fixed magnetization layer, a tunnel barrier layer located between them, and an antiferromagnetic layer located on the plane of the fixed magnetization layer that faces away from its plane in contact with the tunnel barrier layer. The tunnel barrier layer is a nonmagnetic insulating layer through which electrons can pass in a state with spins reserved by the tunnel effect. The rest of the multilayer structure, i.e., the free layer, fixed magnetization layer and antiferromagnetic layer could be basically identical with those used with the spin valve type GMR device.

It is here noted that when the TMR device is used for a reproducing head, it is required to have low resistance for the following reasons. For a magnetic disk system, there is a demand for improved recording density and improved data transfer rate, with which the reproducing head is required to have good high-frequency response. However, as the resistance value of the TMR device grows large, it will cause an increase in stray capacitances occurring at the TMR device and a circuit connected to it, rendering the high-frequency response of the reproducing head worse. This is the reason the TMR device must imperatively have low resistance.

Generally speaking, reducing the thickness of the tunnel barrier layer would work for making the resistance of the TMR device low. However, too thin a tunnel barrier layer would cause a lot more pinholes to occur in the tunnel barrier layer, rendering the service life of the TMR device short. Further, there would be a magnetic couple produced between the free layer and the fixed magnetization layer, ending up with problems: a lot more noise, a drop of the MR ratio, and degradation of TMR device's performance. The noise occurring at the reproducing head is here called head noise. The head noise occurring at the reproducing head using the TMR device includes shot noise—a noise component that is unlikely to occur at a reproducing head using the GMR device. Thus, a problem with the reproducing head using the TMR device is that the head noise is noticeable.

With the CPP-GMR device, on the other hand, there is a problem that no large enough MR ratio is obtained. A possible reason for it could be that spin-polarized electrons are scattered at the interface between the nonmagnetic electroconductive layer and the magnetic layer and in the nonmagnetic electroconductive layer.

Also, the CPP-GMR device, because of having a small resistance value, is low in terms of the amount of resistance change. For this reason, in order to obtain large reproduction output with the CPP-GMR device, high voltage must be applied to that device. However, the application of high voltage to the device offers such problems as described below. With the CPP-GMR device, currents are passed in a direction perpendicular to the plane of each layer, whereupon spin-polarized electrons are poured from the free layer into the fixed magnetization layer or from the fixed magnetization layer into the free layer. Such spin-polarized electrons cause torque (hereinafter called the spin torque) that rotates those magnetizations to be generated at the free layer or the fixed magnetization layer. The magnitude of this spin torque is proportional to a current density. As the voltage applied to the CPP-GMR device grows high, so does the current density with the result that there is large spin torque. As the spin torque increases, there are problems such as changes in the direction of magnetization of the fixed magnetization layer, and the inability of the free layer to freely change the direction of magnetization with respect to an external magnetic field.

To solve such problems, Applicant has already filed Japanese Patent Application No. 2006-275972 to come up with an invention relating to a CPP-GMR device, with which large MR ratios are achieved while noise is held back and the influence of the spin torque is minimized.

That is, in a preferable embodiment of that invention, a spacer layer interleaved between the free layer and the fixed magnetized layer has typically a Cu/ZnO/Cu multilayer structure, and the area resistivity (AR) of a magneto-resistive effect device and the electro-conductivity of the spacer layer are determined in such a way as to fall within the given ranges.

By allowing the spacer layer to have typically a three-layer structure of Cu/ZnO/Cu according to this proposal, large MR ratios are achievable while holding back noise and reducing the influence of the spin torque.

The present invention is to make improvements in or relating to Japanese Patent Application No. 2006-275972, and embodied as follows.

It has thus been confirmed that, as proposed in Japanese Patent Application No. 2006-275972, if there is, for instance, a triple-layer structure of Cu/ZnO/Cu provided using a semiconductor oxide layer for the middle lay of the spacer layer, much higher MR ratios are then achievable. However, intensive studies made by the inventors about the magneto-resistive effect device having that arrangement have revealed that device characteristics tend to fluctuate or deteriorate over time due to heat and stress exposed to the device in the process. As a result of intensive experimentation made by the inventors to learn why it is caused, it has been found that at a position of junction of the semiconductor oxide layer used for the spacer layer to an insulating layer formed for providing an electrical protection of the side of the CPP-GMR device, there is oxygen flowing out of the semiconductor oxide layer, inhibiting the semiconductor oxide layer from producing its own function.

The situations being like this, an object of the invention to provide a novel magneto-resistive effect device structure using a semiconductor oxide layer for a spacer layer, which is less likely to undergo fluctuations or deteriorations over time of device characteristics due to heat and stress exposed to the device in the process.

Note here that the prior art that seems to be most relevant to the invention of this application is JP-A-2003-8102. This prior art sets forth a CPP-GMR device comprising a fixed magnetization layer having a fixed magnetization direction, a free magnetization layer with its magnetization direction changing depending on an external magnetic field, a nonmagnetic metal intermediate layer interleaved between the fixed magnetization layer and the free magnetization layer, and a resistance control layer interleaved between the fixed magnetization layer and the free magnetization layer and formed of a material having conduction carriers of up to $10^{22}/cm^3$. However, the prior art does not say anything at al about the "nitrogen element-containing interface protective layer"—the requirement for the invention of this application.

SUMMARY OF THE INVENTION

According to the invention of this application, the aforesaid object is accomplishable by the provision of a giant magneto-resistive effect device (CPP-GMR device) having the CPP (current perpendicular to plane) structure comprising a spacer layer, and a first ferromagnetic layer and a second ferromagnetic layer stacked together with said spacer layer sandwiched between them, with a sense current applied in the stacking direction, wherein the first ferromagnetic layer and the second ferromagnetic layer function such that the angle made between the directions of magnetizations of both layers changes relatively depending on an external magnetic field, said spacer layer contains a semiconductor oxide layer, and at a position where the semiconductor oxide layer forming the whole or a part of said spacer layer contacts an insulating layer, there is a nitrogen element-containing interface protective layer interposed between said semiconductor layer and said insulating layer.

In a preferable embodiment of the magneto-resistive effect device according to the invention, said spacer layer comprises a first nonmagnetic metal layer and a second nonmagnetic metal layer, each made of a nonmagnetic metal material, and a semiconductor oxide layer interposed between the first nonmagnetic metal layer and the second nonmagnetic metal layer.

In a preferable embodiment of the magneto-resistive effect device according to the invention, said spacer layer is made up of a semiconductor oxide layer.

In a preferable embodiment of the magneto-resistive effect device according to the invention, said nitrogen element-containing interface protective layer is at least one selected from the group consisting of SiN, SiON, AlON, BN, and BON.

In a preferable embodiment of the magneto-resistive effect device according to the invention, the nitrogen element contained in said interface protective layer is contained in anions forming the interface protective layer in an amount of at least 10 at %.

In a preferable embodiment of the magneto-resistive effect device according to the invention, said interface protective layer has a thickness of at least 0.3 nm.

In a preferable embodiment of the magneto-resistive effect device according to the invention, said semi-conductor oxide layer is at least one selected from the group consisting of oxides of Zn, In, Sn, Ti, Ga, Cd, Pb, InZn, InAg, InGa, ZnSn, ZnGa, CdSn, CdGe, CaAl, GaInZn, and GaInMg.

In a preferable embodiment of the magneto-resistive effect device according to the invention, the semiconductor oxide layer forming said spacer layer has a thickness of 0.3 to 5 nm.

In a preferable embodiment of the magneto-resistive effect device according to the invention, said first and second nonmagnetic metal layers are each at least one selected from the group consisting of Cu, Zn, Au, and Ag.

In a preferable embodiment of the magneto-resistive effect device according to the invention, said first and second nonmagnetic metal layers have each a thickness of 0.3 to 2.0 nm.

The invention also provides a thin-film magnetic head, comprises a plane opposite to a recoding medium, a magneto-resistive effect device as recited above, which is located near said medium opposite plane for detecting a signal magnetic field from said recording medium, and a pair of electrodes for passing a current in the stacking direction of said magneto-resistive effect device.

Further, the invention provides a head gimbal assembly, comprising a slider including a thin-film magnetic head as recited above and located in opposition to a recording medium, and a suspension adapted to resiliently support said slider.

Furthermore, the invention provides a magnetic disk system, comprising a slider including a thin-film magnetic head as recited above and located in opposition to a recording medium, and a positioning means adapted to support and position said slider with respect to said recording medium.

In the invention, at a position where the semiconductor oxide layer used for the spacer layer contacts an insulating layer formed for providing an electrical protection of the side of the CPP-GMR device, the nitrogen element-containing interface protective layer is provided whereby there is a nitride of high covalent bonding capability formed at the surface of junction of the semiconductor oxide layer to the interface protective layer, inhibiting the migration of oxygen from the semi-conductor oxide layer and, hence, holding back fluctuations or deteriorations of device characteristics.

EXPLANATION OF THE PREFERRED EMBODIMENTS

The best mode for carrying out the invention is now explained in details.

Figure 1:
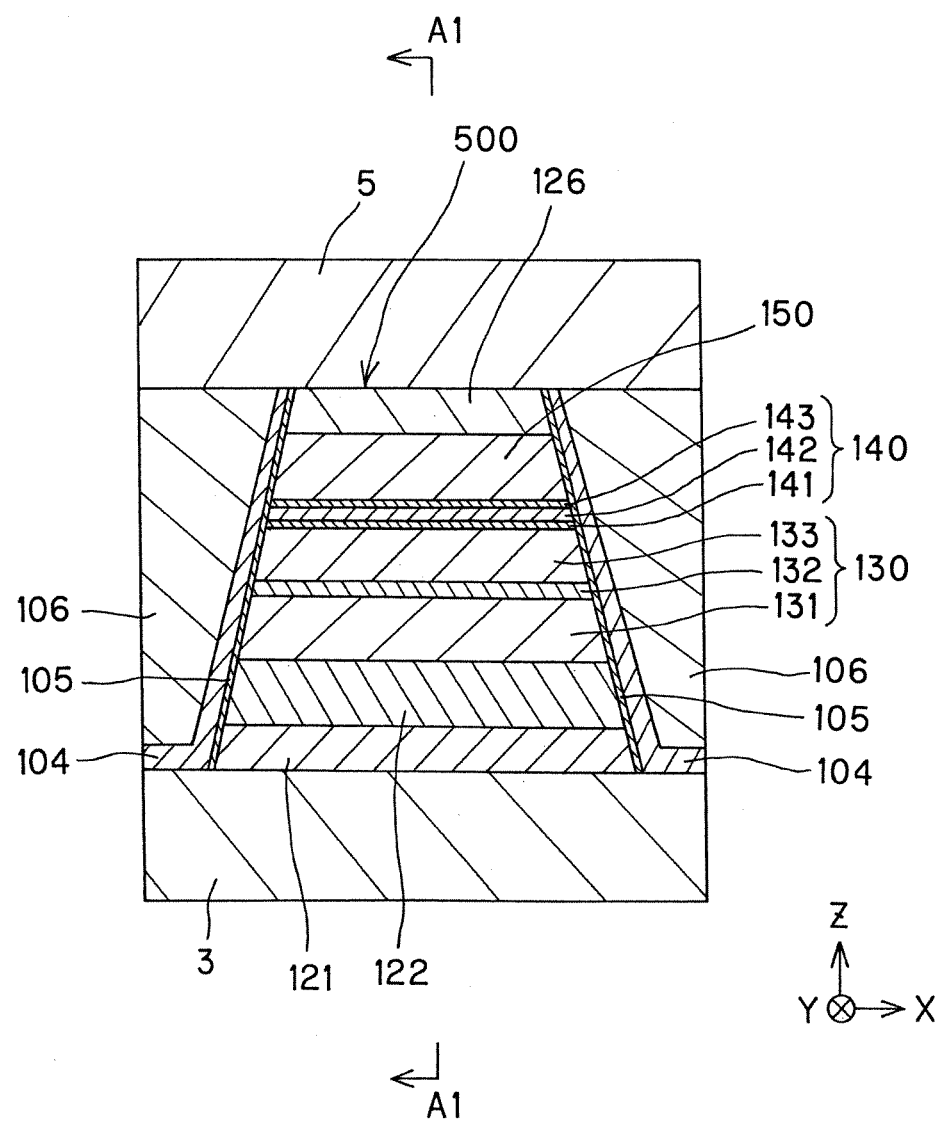
FIG. 1 is a sectional view illustrative of a section of an embodiment of the invention primarily parallel with the plane of a reproducing head in opposition to a medium.

FIG. 1 is illustrative of the ABS (air bearing surface) of a reproducing head in an embodiment of the invention; FIG. 1 is illustrative in schematic of the ABS of the giant magneto-resistive effect device (CPP-GMR device) having a CPP structure—part of the invention. The ABS is generally corresponding to a plane (hereinafter often called the medium opposite plane) at which a reproducing head is in opposition to a recording medium; however, it is understood that the ABS here includes even a section at a position where the multilayer structure of the device can be clearly observed. For instance, a protective layer of DLC or the like (the protective layer adapted to cover the device), in a strict sense, positioned facing the medium opposite plane may be factored out, if necessary.

Figure 2:
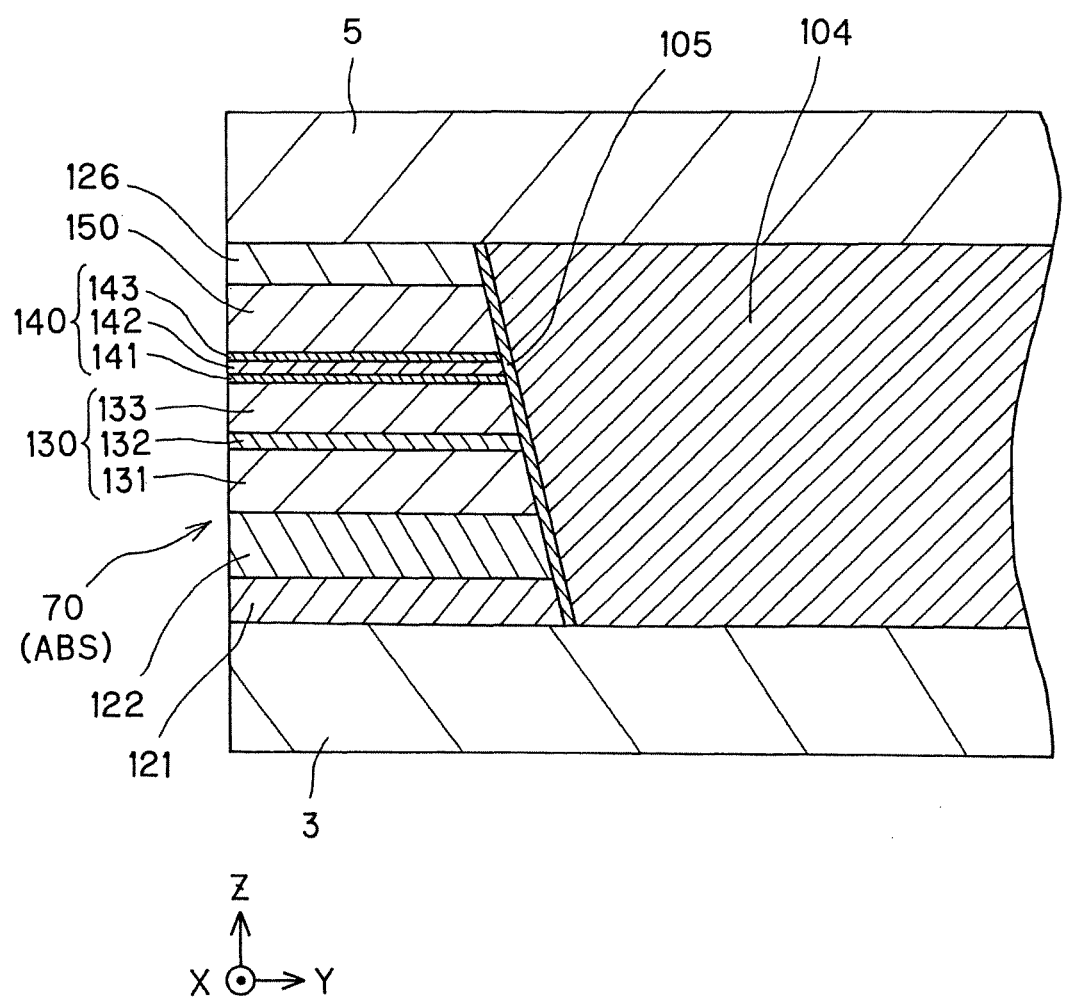
FIG. 2 is a view as taken on the arrowed A1-A1 section of FIG. 1.

FIG. 2 is illustrative of the construction of the thin-film magnetic head according to one preferable embodiment of the invention; it is a sectional view as taken on the arrowed section A1-A1 of FIG. 1.

Figure 3:
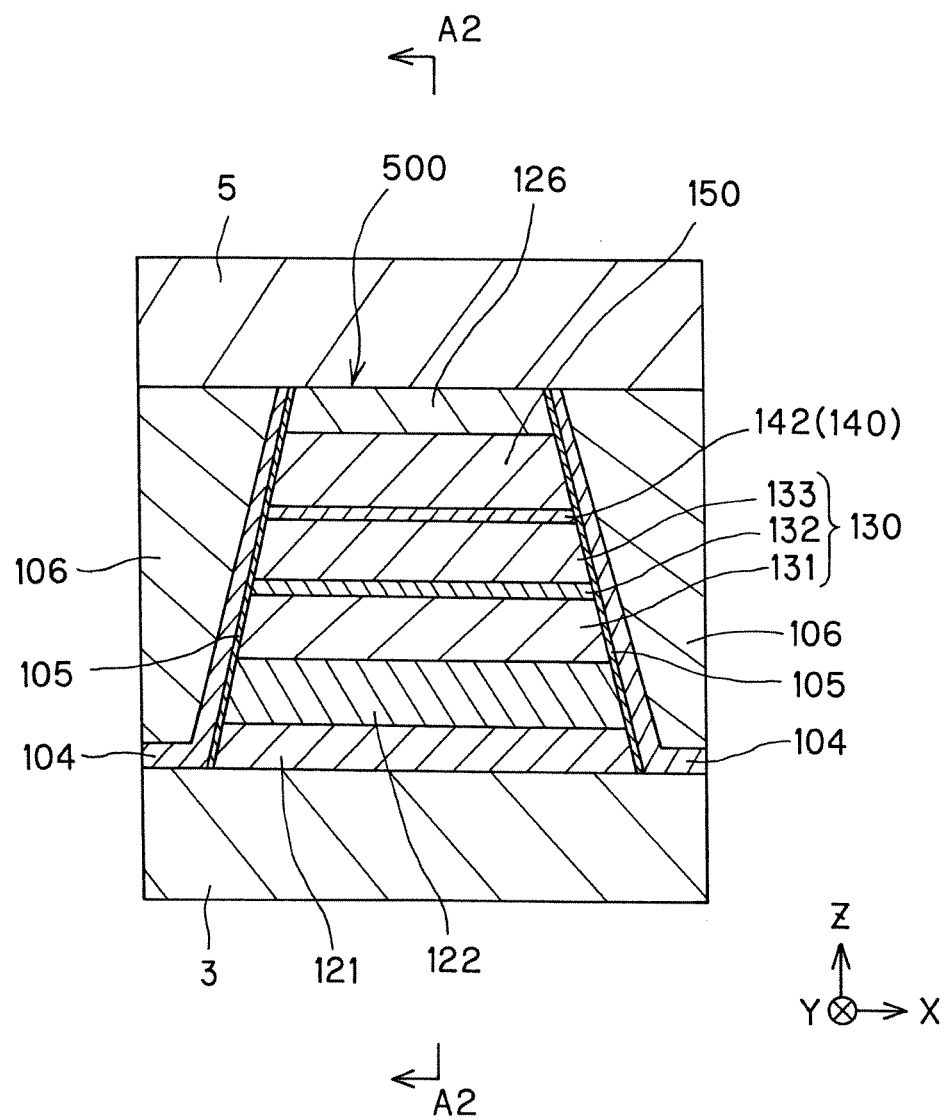
FIG. 3 is a sectional view illustrative of a section of an embodiment of the invention primarily parallel with the plane of a reproducing head in opposition to a medium.

FIG. 3 is illustrative of the ABS (air bearing surface of the reproducing head in another embodiment of the invention; it is illustrative in schematic of the ABS of the giant magneto-resistive effect device of the CPP structure (the CPP-GMR device)—part of the invention in particular.

Figure 4:
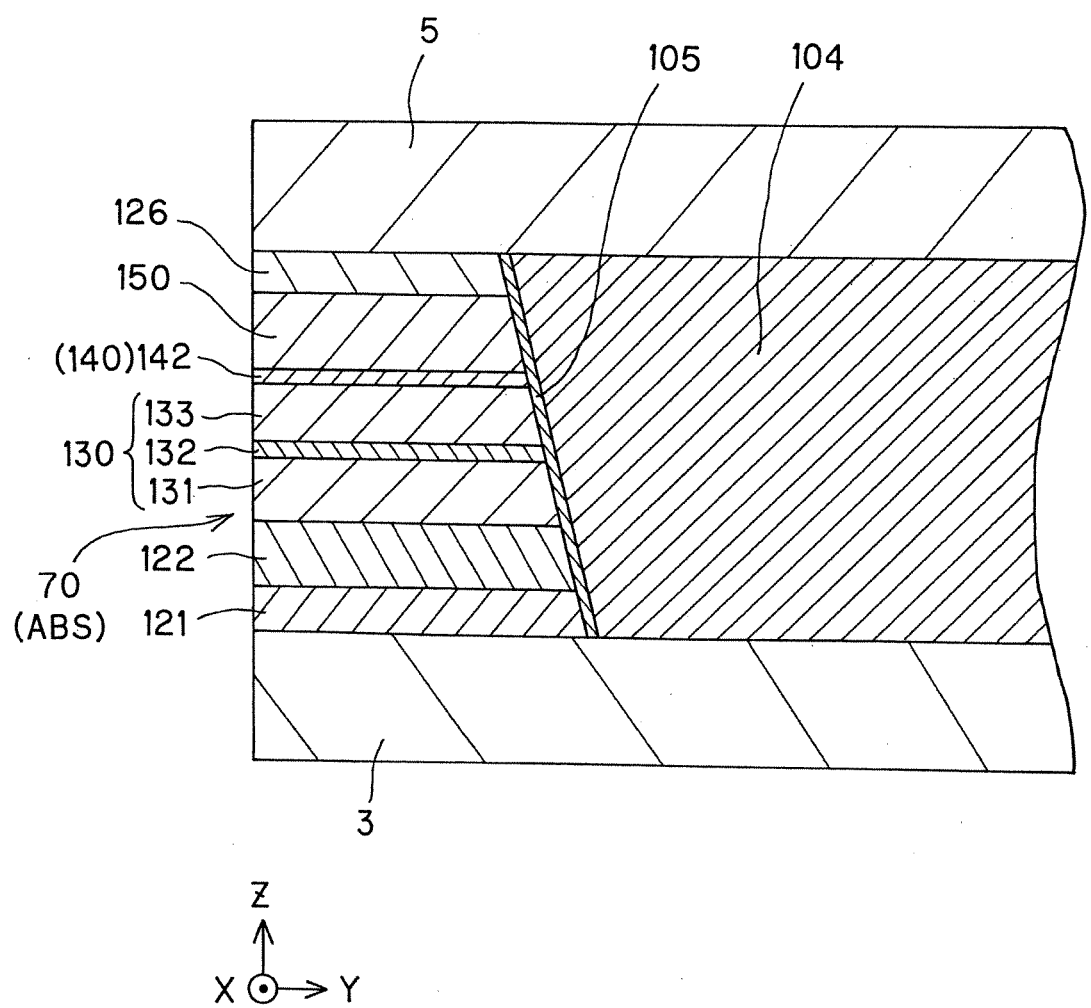
FIG. 4 is a view as taken on the arrowed A2-A2 section of FIG. 3.

FIG. 4 is illustrative of the construction of the thin-film magnetic head according to one preferable embodiment of the invention; it is a sectional view as taken on the arrowed A2-A2 section of FIG. 3.

In the following disclosure of the invention, the sizes of each device component in the X-, Y- and Z-axis directions shown in the drawings will be referred to as the "width", "length" and "thickness", respectively. The side of the device nearer to the air bearing surface (the plane of the thin-film magnetic head in opposition to the recording medium) in the Y-axis direction will be called "forward" and the opposite side (depth-wise side) will be called "rearward", and the direction of stacking the individual films up will be called "upward" or "upper side" and the opposite direction will be called "downward" or "lower side".

[Giant Magneto-Resistive Effect Device (CPP-GMR Device) Having the CPP Structure]

The construction of a reproducing head comprising the inventive giant magneto-resistive effect device (CPP-GMR device) having the CPP structure is now explained in details with reference to FIG. 1.

As noted above, FIG. 1 is a sectional view corresponding to a section of the reproducing head parallel with the medium opposite plane.

As shown in FIG. 1, the reproducing head according to the embodiment here comprises a first shield layer 3 (also called the lower shield layer 3) and a second shield layer 5 (also called the upper shield layer 5) that are located at a given space and opposed vertically on the sheet, a giant magneto-resistive effect device 500 (hereinafter referred to as the GMR device 500) inter-posed between the first shield layer 3 and the second shield layer 5, an interface protective layer 105 formed directly contiguous to two sides of the GMR device 500 (see FIG. 1) and an interface protective layer 105 formed directly contiguous to the rear of the GMR device 500 (see FIG. 2), and an insulating film 104 formed round the GMR device 500 via this interface protective layer 105.

Further, as shown in FIG. 1, two bias magnetic field-applying layers 106 are formed on two sides of the GMR device 500 via an insulating layer 104.

In the embodiment here, the first 3 and the second shield layer 5 take a so-called magnetic shield role plus a pair-of-electrodes role. In other words, they have not only a function of shielding magnetism but also function as a pair of electrodes adapted to pass a sense current through the GMR device 500 in a direction intersecting the plane of each of the layers forming the GMR device 500, for instance, in a direction perpendicular to the plane of each of the layers forming the GMR device 500 (stacking direction).

Apart from the first 3 and the second shield layer 5, another pair of electrodes may be additionally provided above and below the GMR device.

Referring to the inventive GMR device 500 having the CPP structure in terms of a broad, easy-to-understand concept, it comprises a spacer layer 140, and a first ferromagnetic layer 130 and a second ferromagnetic layer 1540 stacked together with the spacer layer 140 sandwiched between them, as shown in FIG. 1. The first ferromagnetic layer 130 and the second ferromagnetic layer 150 function such that the angle made between the directions of magnetizations of both layers changes relatively depending on an external magnetic field.

Referring here to a typical embodiment of the invention, the first ferromagnetic layer 130 functions as a fixed magnetization layer having its magnetization fixed, and the second ferromagnetic layer 150 functions as a free layer having a direction of its magnetization changing depending on an external magnetic field, i.e., a signal magnetic field from a recording medium. It follows that the first ferromagnetic layer 130 is the fixed magnetization layer 130, and the second ferromagnetic layer 150 is the free layer 150.

The fixed magnetization layer 130 has its magnetization direction fixed under the action of an antiferromagnetic layer 122. While an embodiment with the antiferromagnetic layer 122 formed on a bottom side (the side of the first shield layer 3) is shown in FIG. 1, it is contemplated that the antiferromagnetic layer 122 may be formed on a top side (the side of the second shield layer 5) to interchange the free layer 150 and the fixed magnetization layer 130 in position.

(Explanation of the Fixed Magnetization Layer 130)

In the invention, the fixed magnetization layer 130 is formed on the antiferromagnetic layer 122 having a pinning action via an underlay layer 121 formed on the first shield layer 3.

In a preferable embodiment of the invention, the fixed magnetization layer 130 has a so-called synthetic pinned layer comprising, in order from the side of the antiferromagnetic layer 122, an outer layer 131, a non-magnetic intermediate layer 132 and an inner layer 133, all stacked together in order.

The outer layer 131, and the inner layer 133 is provided by a ferromagnetic layer made of, for instance, a ferromagnetic material containing Co, and Fe. The outer 131 and the inner layer 133 are antiferromagnetically coupled and fixed such that their magnetization directions are opposite to each other.

The outer 131, and the inner layer 133 is preferably made of, for instance, a $Co_{70}Fe_{30}$ (atomic %) alloy. The outer layer has a thickness of preferably about 3 to 7 nm, and the inner layer 133 has a thickness of preferably about 3 to 10 nm. The inner layer 133 may also contain a Heusler alloy layer.

For instance, the nonmagnetic intermediate layer 132 is made of a nonmagnetic material containing at least one selected from the group consisting of Ru, Rh, Ir, Re, Cr, Zr and Cu, and has a thickness of, for instance, about 0.35 to 1.0 nm. The nonmagnetic intermediate layer 132 is provided to fix the magnetization of the inner layer 133 and the magnetization of the outer layer 131 in mutually opposite directions. The phrase "magnetization in mutually opposite directions" stands for a broad concept that encompasses just only two such magnetizations in just opposite directions of 1800 but also those in different directions of 180°±20° as well.

(Explanation of the Free Layer 150)

The free layer 150 has its magnetization direction changing depending on an external magnetic field, i.e., a signal magnetic field from the recording medium, and is made of a ferromagnetic layer (soft magnetic layer) having a small coercive force. The free layer 150 has a thickness of, for instance, about 2 to 10 nm, and may be in either a single layer form or a multilayer form including a plurality of ferromagnetic layers. The free layer 150 may also contain a Heusler alloy layer.

On such a free layer 150, there is a protective layer 126 formed, which comprises a Ta or Ru layer as an example, as shown in FIG. 1. The protective layer 126 has a thickness of about 0.5 to 20 nm.

(Explanation of the First Embodiment of the Spacer Layer 140)

In the first embodiment of the invention, the spacer layer 140 is made of a first nonmagnetic metal layer 141 and a second nonmagnetic metal layer 143, and a semiconductor oxide layer 142 interposed between these first and second non-magnetic metal layers 141 and 143.

More specifically, the spacer layer 140 is made of a three-layer structure comprising the first nonmagnetic metal layer 141/semiconductor oxide layer 142/the second nonmagnetic metal layer 143 stacked together in order. In the embodiment here, the first nonmagnetic metal layer 141 is positioned on the side of the fixed magnetization layer 130, while the second nonmagnetic metal layer 143 is positioned on the side of the free layer 150, as depicted in FIG. 1. These layers are each explained in more details.

Semiconductor Oxide Layer 142

The material of the semiconductor oxide layer 142 forming the spacer layer 140, for instance, may be exemplified by the oxides of Zn, In, Sn, Ti, Ga, Cd, Pb, InZn, InAg, InGa, ZnSn, ZnGa, CdSn, CdGe, CaAl, GaInZn, and GaInMg, which may further contain additives in an amount of up to 10 atomic % in terms of the ratio of the number of metal atoms. In other words, the material of the semiconductor oxide layer 142 here is understood to mean an oxide that contains, and does not contain, additives.

Particular preferable for the material of the semiconductor oxide layer 142 is ZnO, InO, and SnO.

The semiconductor oxide layer 142, for instance, may be formed by sputtering using the desired oxide target.

Such a thin film is commonly heat-treated at 200 to 350° C. for 1 to 10 hours after film-formation for the purpose of crystallizing the semiconductor oxide layer 142 to make its resistance low. The phrase "after film-formation" includes both after the film formation for the semiconductor oxide layer and after the film formation for the whole device. Usually, heat treatment is carried out after the film formation for the whole device.

Such semiconductor oxide layer 142 used may have a thickness of 0.5 to 3 nm. In particular, that thickness may as well be determined in consideration of the resistance area needed for CPP-GMR devices.

The First 141, and the Second Nonmagnetic Metal Layer 143

For the nonmagnetic metal material used for the first 141 and the second nonmagnetic metal layer 143, for instance, there can be the mention of at least one selected from Cu, Zn, Au, Ag, AuCu, CuZn, Cr, Ru, Rh, and Pt, among which Cu, Zn, Au, and Ag is most preferred.

The first 141, and the second nonmagnetic metal layer 143 should have a thickness of about 0.3 to 2.0 nm.
(Explanation of the Second Embodiment of the Spacer Layer 140)

In the second embodiment of the invention, the spacer layer 140 may be made up of the semiconductor oxide layer 142 alone, as shown in FIGS. 3 and 4. The material of the semiconductor oxide layer 142 used may be chosen from among the materials exemplified for the first embodiment of the invention. When the spacer layer 140 is composed solely of the semiconductor oxide layer 142, the desired characteristics should be obtained by setting up the spacer layer 140 while care is taken of the diffusion of oxygen atoms from the spacer layer 140 to the free layer 150 or the inner layer 133.
(Explanation of the Antiferromagnetic Layer 122)

The antiferromagnetic layer 122 works such that by way of exchange coupling with the fixed magnetization layer 130 as described above, the magnetization direction of the fixed magnetization layer 130 is fixed.

For instance, the antiferromagnetic layer 122 is made of an antiferromagnetic material containing at least one element M' selected from the group of Pt, Ru, Rh, Pd, Ni, Cu, Ir, Cr and Fe, and Mn. The content of Mn is preferably 35 to 95 at %. The antiferromagnetic material is broken down into two types: (1) a non-heat treatment type antiferromagnetic material that shows anti-ferromagnetism even in the absence of heat treatment to induce an exchange coupling magnetic field between it and a ferromagnetic material, and (2) a heat treatment type antiferromagnetic material that comes to show anti-ferromagnetism by heat treatment. In the invention, both types (1) and (2) may be used without restriction. For instance, the non-heat treatment type antiferromagnetic material is exemplified by RuRhMn, FeMn, and IrMn, and the heat treatment type antiferromagnetic material is exemplified by PtMn, NiMn, and PtRhMn.

The antiferromagnetic layer 122 has a thickness of about 5 to 30 nm.

It is here noted that for the layer for fixing the magnetization direction of the fixed magnetization layer 130, it is acceptable to use a hard magnetic layer comprising a hard magnetic material such as CoPt in place of the aforesaid antiferromagnetic layer.

The underlay layer 121 formed below the anti-ferromagnetic layer 122 is provided to improve the crystallization and orientation of each of the layers stacked on it in general, and the exchange coupling of the antiferromagnetic layer 122 and the fixed magnetization layer 130 in particular. For such underlay layer 121, for instance, a multilayer structure of Ta and NiCr layers is used. The underlay layer 121 has a thickness of about 2 to 6 nm as an example.

The area resistivity, AR, of the magneto-resistive effect device 500 (CPP-GMR device 500) is in the range of 0.1 to 0.3 $\Omega \cdot \mu m^2$, preferably 0.12 to 0.3 $\Omega \cdot \mu m^2$, and more preferably 0.14 to 0.28 $\Omega \cdot \mu m^2$. Any deviation from the range of 0.1 to 0.3 $\Omega \cdot \mu m^2$ would make it difficult to obtain large MR ratios while reducing noise and holding back the influences of spin torque.

The device (CPP-GMR device) to be measured for its area resistivity is a multilayer arrangement comprising the underlay layer 121, antiferromagnetic layer 122, fixed magnetization layer 130, spacer layer 140, free layer 150 and protective layer 126, as shown in FIG. 1.
(Explanation of the Interface Protective Layer 105)

The interface protective layer 105, with its own function in mind, may just as well be located only at a position where the semiconductor oxide layer 142 used originally for the spacer layer comes in contact with the insulating layer 104. This is because the interface protective layer 105 works forming a nitride at the interface of the end of the semiconductor oxide layer 142, inhibiting the migration of oxygen from the semiconductor oxide layer 142 to the insulting layer 104, thereby holding back fluctuations or deteriorations of device characteristics.

For convenience of the formation of the interface protective layer 105, however, it is general that, as shown in FIGS. 1 and 2, the interface protective layer 105 is formed substantially all over the area of the side and rear end of the CPP-GMR device 500.

The interface protective layer 105 contains a nitrogen element, and is specifically made of at least one selected from the group consisting of SiN, SiON, AlON, BN and BON. The content of the nitrogen element contained in the interface protective layer 105 is at least 10 at %, preferably 10 to 100 at %, and more preferably 10 to 20 at % of anions forming the interface protective layer 105. The anions forming the interface protective layer 105 are O and N in the compounds as specifically exemplified above.

As the nitrogen element is less than 10 at %, it brings about the inconvenience that even when the interface protective layer 105 is provided, there is no nitride formed at the interface of the end of the semiconductor oxide layer 142: heat resistance gets worse resulting in increasing resistance fluctuations before and after heat treatment.

The interface protective layer 105 should preferably have a thickness of at least 0.3 nm, and especially 0.3 to 5.0 nm. At less than 0.3 nm, there is the inconvenience that even when the interface protective layer 105 is provided, there is no nitride formed at the interface of the end of the semiconductor oxide layer 142: heat resistance gets worse resulting in increasing resistance fluctuations before and after heat treatment.

The nitrogen element-containing interface protective layer 105 may be formed by sputtering in an atmosphere containing nitrogen gas or sputtering using a nitride target.
(Explanation of the Insulting Layer 104)

The insulating layer 104 formed outside and contiguous to the interface protective layer 105 is made of at least one selected from the group consisting of $Al_2O_3$, $SiO_2$, MgO, $ZrO_2$, $HfO_2$, AlN, SiN, BN, Si, and DLC (diamond-like carbon).

Originally, the insulating layer 104 is formed to provide an electrical protection to the side and rear end of the CPP-GMR device 500. To obtain its function stably, the insulating layer 104 should preferably be made of $Al_2O_3$, $SiO_2$, MgO, $ZrO_2$, and $HfO_2$.

In the invention, because the interface protective layer 105 is interposed between the semiconductor oxide layer 142 used for the spacer layer and the insulating layer 104, there is a nitride of high covalent bonding capability formed at the surface of junction of the semiconductor oxide layer 142, which works inhibiting the migration of oxygen from the semiconductor oxide layer 142 to the insulting layer 104 and, hence, holding back device characteristics fluctuations and deteriorations.
(Explanation of the Whole Structure of the Thin-Film Magnetic Head)

One preferable, exemplary whole structure of the thin-film magnetic head according to the invention is now explained with reference to FIGS. 5A, 5B, 6 and 7.

Figure 5B:
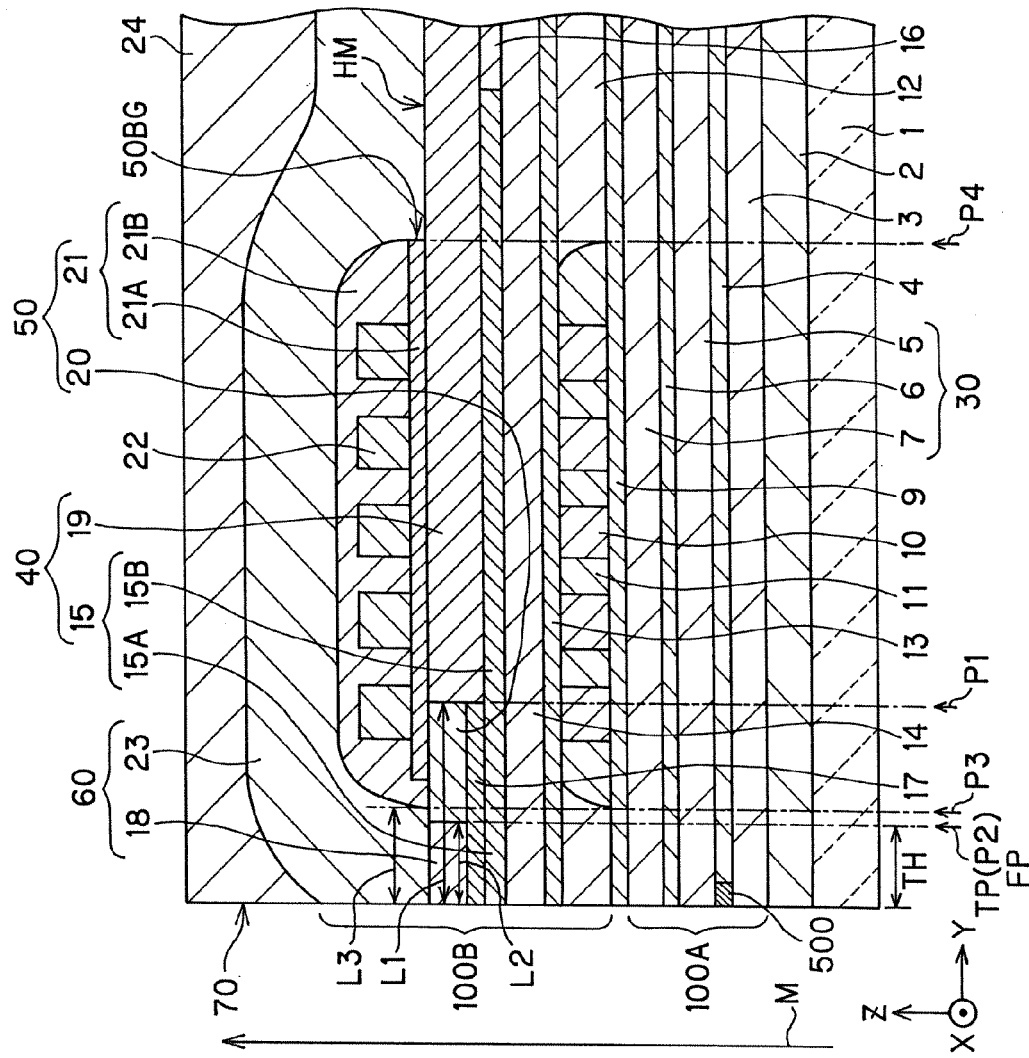
FIG. 5B is a sectional view of the thin-film magnetic head orthogonal to the air bearing surface.
Figure 5A:
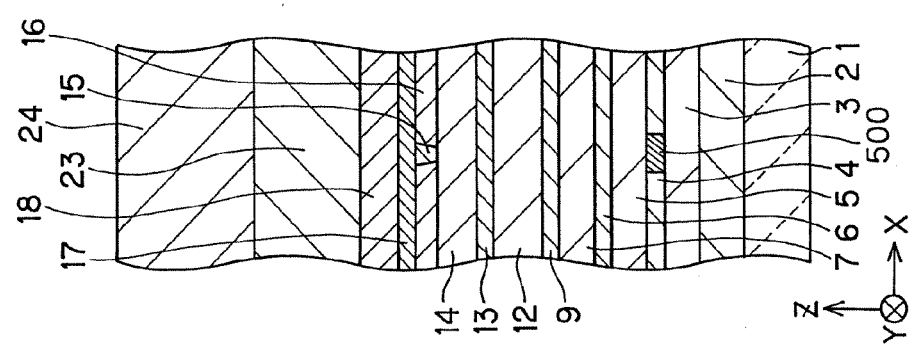
FIG. 5A is a sectional view of the thin-film magnetic head parallel with the so-called air bearing surface (ABS)
Figure 6:
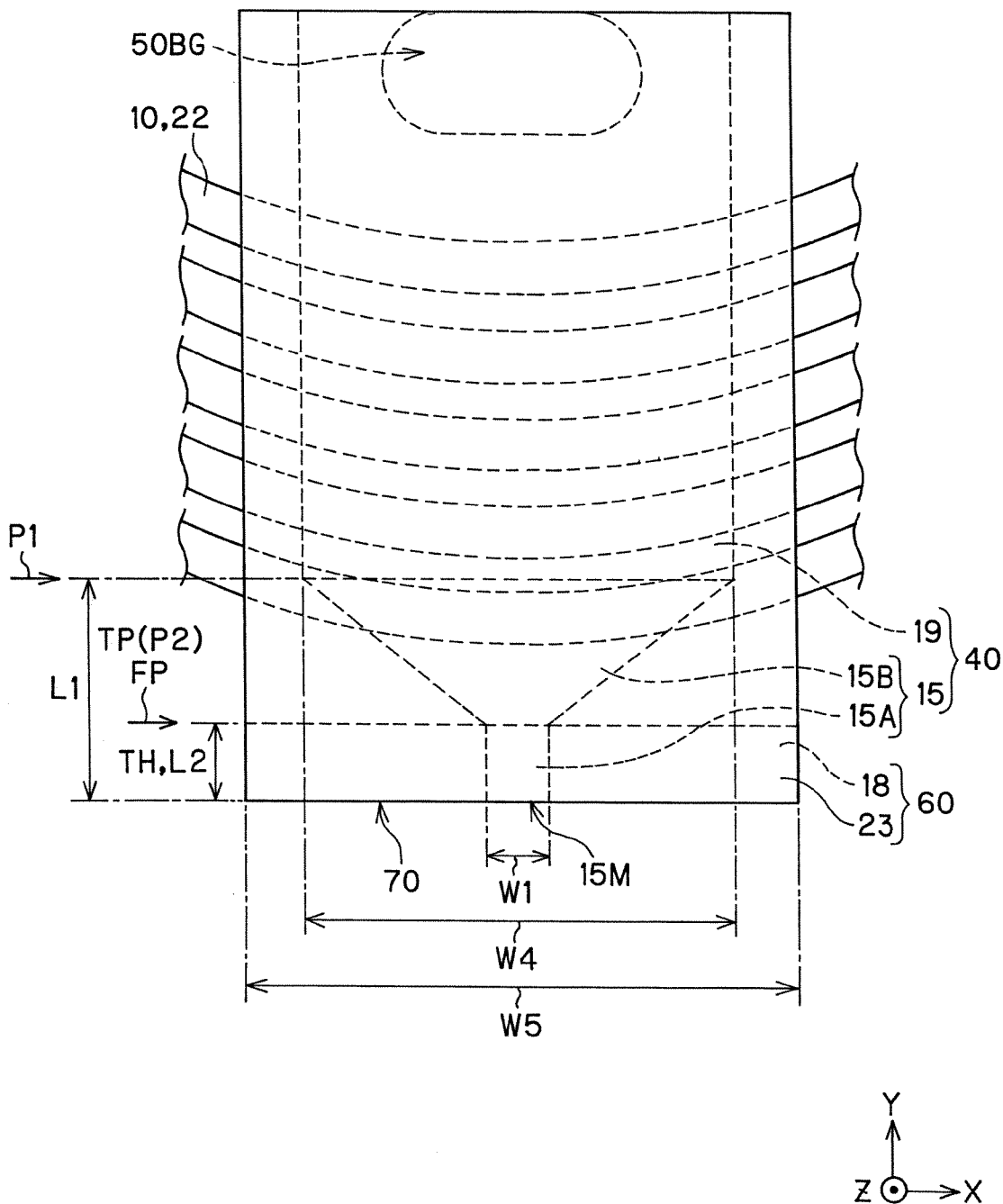
FIG. 6 is an enlarged perspective view of a portion of the write head near the magnetic pole layer.
Figure 7:
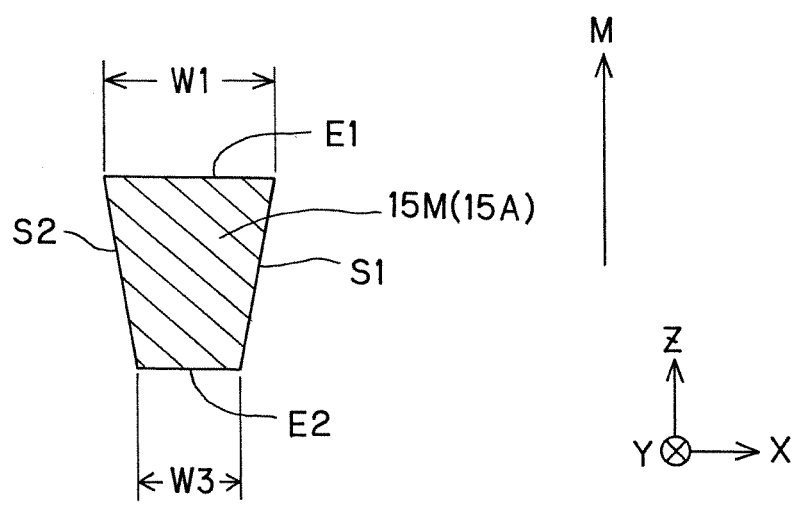
FIG. 7 is illustrative of the morphology of the end portion of the main magnetic pole at the air bearing surface.

FIG. 5A is a sectional view of the thin-film magnetic head parallel with the so-called air bearing surface (ABS), and FIG. 5B is a sectional view of the thin-film magnetic head orthogonal to the air bearing surface. The air bearing surface (ABS) here is tantamount to the plane at which the thin-film magnetic head is in opposition to the magnetic recording medium (hereinafter also called the medium opposite plane). FIG. 6 is an enlarged perspective view of a portion of the write head near the magnetic pole layer, and FIG. 7 is illustrative of the morphology of the end portion of the main magnetic pole at the air bearing surface.

The thin-film magnetic head shown in FIGS. 5A and 5B is mounted on, and used with, a magnetic recording system such as a hard disk drive for the purpose of applying magnetic processing to a recording medium like a hard disk drive moving in the medium travel direction M.

For instance, the thin-film magnetic head illustrated in the drawings is a composite type head capable of implementing both recording and reproducing as magnetic processing. The structure comprises, as shown in FIG. 5, a substrate 1 made of a ceramic material such as AlTiC (Al$_2$O$_3$.TiC), and an insulating layer 2 made of a nonmagnetic insulating material such as aluminum oxide (Al$_2$O$_3$; hereinafter referred simply as alumina), a reproducing head portion 100A adapted to reproduce magnetic information recorded by harnessing the magneto-resistive (MR) effect, a separation layer 9 made of a nonmagnetic insulating material such as alumina, a shield type recording head portion 100B adapted to implement a perpendicular recording mode of recording processing, and an overcoat layer 24 made of a nonmagnetic insulating material such as alumina, all stacked one upon another on the substrate 1 in that order.

In the embodiment illustrated, the reproducing head portion 100A has a multilayer structure comprising a lower read shield layer 3, a magneto-resistive effect device 500, and a shield layer 5 (in this embodiment, a part of an upper read shield layer 30) stacked one upon another in that order. At the rear end face of the magneto-resistive effect 500 there is a shield gap layer 4 formed.

In the embodiment shown in FIGS. 5A and 5B, both the lower 3 and the upper read shield layer 30 have a function of separating the magneto-resistive effect device magnetically from the surroundings, extending rearward from the air bearing surface 70.

In the embodiment here, the upper read shield layer 30 has a structure in which it is divided into two shield layers 5 and 7 in its thickness direction with a nonmagnetic layer 6 held between them. In other words, that upper read shield layer 30 has a structure where the upper first read shield layer 5, the nonmagnetic layer 6 and the upper second read shield layer 7 are stacked one upon another in order from a side near to the shield gap film 4.

The upper first read shield layer 5 is made of a magnetic material such as permalloy, and has a thickness of typically about 1.5 µm. The upper second read shield layer 7 is made of a magnetic material such as permalloy, too, and has a thickness of typically about 1.1 µm. The nonmagnetic layer 6 is made of a nonmagnetic material such as ruthenium (Ru) or alumina, and has a thickness of typically about 0.2 µm.

While it is shown and described that the upper read shield layer 30 has a multilayer structure, it is contemplated that it is not always required to have a multilayer structure; it could have a single-layer structure as is the case with the lower read shield layer 3.

The shield gap film 4, for instance, made of a nonmagnetic material such as alumina.

The recording head portion 100B, for instance, has a multilayer structure comprising a first-stage thin-film coil 10 buried around with insulating layers 11, 12, 13, a nonmagnetic layer 14, a main magnetic pole layer 40 partially buried around with an insulating layer 16, a gap layer 17, a second-stage thin-film coil 22 buried with an insulating layer 50 that forms a magnetic coupling opening (back gap 50BG) and a write shield layer 60, all stacked one upon another in order.

In FIG. 6, only a main part (thin-film coils 10, 22, main magnetic pole layer 40 and write shield layer 60) extracted out of the recording head portion 100B is primarily shown.

The thin-film coil 10 has a primary function of generating a leakage-preventive magnetic flux for holding back leakage of a recording magnetic flux produced at the thin-film coil 22. This thin-film coil 10 is made of a highly electroconductive material such as copper, and has a thickness of typically about 2.0 µm.

As typically shown in FIGS. 5 and 6, the thin-film coil 10 in particular has a spiral structure having turns about the back gap 50BG. The thin-film coil 10 typically operates such that currents flow in a direction opposite to the direction taken by currents flowing through the thin-film coil 22. While it is shown in FIGS. 5 and 6 that the thin-film coil 10 has five turns by way of illustration alone, it is contemplated that the number of turns could optionally be varied. Preferably, the thin-film coil 10 should have as many turns as the thin-film coil 22, for instance, 2 to 7 turns. The thin-film coil 10 may also be configured as a helical coil.

The insulating layers 11, 12, 13 are formed in such a way as to separate the thin-film coil 10 electrically from the surroundings. The insulating layer 11 is formed in such a way as to be filled up between the turns of the thin-film coil 10 and provide a cover around the thin-film coil 10. This insulating layer 11 is made of a non-magnetic insulating material such as a photoresist (photosensitive material) exhibiting fluidity upon heating, and has a thickness of typically about 2.0 µm.

In the embodiment here, the insulating layer 11 is formed in such a way as to cover only the sides of the thin-film coil 10 but provide no cover to the upper side of the thin-film coil 10, as shown in FIG. 5.

The insulating layer 12 is formed in such a way as to provide a cover around the insulating layer 11. This insulating layer 12 is made of a nonmagnetic material such as alumina, and has a thickness of typically about 2.0 µm.

The insulating layer 13 is formed in such a way as to give a cover to the thin-film coil 10 as well as the insulating layers 11, 12. This insulating layer 13 is made of a nonmagnetic material such as alumina, and has a thickness of typically about 0.2 µm.

The nonmagnetic layer 14 is formed of a nonmagnetic insulating material such as alumina, or a nonmagnetic electroconductive material such as ruthenium, and has a thickness of typically about 1.0 µm.

The main magnetic pole layer 40 has a primary function of implementing recording processing by receiving a magnetic recording magnetic flux produced at the thin-film coil 22 and releasing that magnetic flux toward the recording medium for implementing recording processing. More specifically, the main magnetic pole layer 40 is to generate a magnetic field (perpendicular magnetic field) to magnetize the recording medium in a direction orthogonal to its surface on the basis of a recording magnetic flux, thereby implementing recording processing in the perpendicular recording mode.

Such main magnetic pole layer 40 is located on the leading side of the thin-film coil, extending rearward from the air bearing surface 70, more specifically, as far as the back gap 50BG. It is noted that when the state of movement of the recording medium that moves toward the medium travel direction M shown in FIG. 5 is viewed as a sort of flow, the aforesaid "leading side" would refer to the incoming side (opposite to the medium travel direction M side) of that flow that is here corresponding to the upstream side in the thickness (Z-axis) direction. By contrast, the outgoing side of the flow (the medium travel direction M side) would be called the "trailing side" that is here corresponding to the downstream side in the thickness direction.

In the embodiment here, the main magnetic pole layer 40 has a structure where, as shown in FIG. 5, a main magnetic pole 15 and a magnetic pole main layer 19 are stacked one upon another in order and thereby coupled to each other. In other words, it has a multilayer (double-layer) structure where the main magnetic pole 15 is located on the leading side and the magnetic pole main layer 19 is located on the trailing side.

The main magnetic pole 15 functions as a portion for releasing off a main writing magnetic flux. This main magnetic pole 15 extends rearward from the air bearing surface 70 on the leading side, more specifically, as far as the back gap 50BG, and has a thickness of typically about 0.25 µm. Such main magnetic pole 15, for instance, is made of a magnetic material having a saturation magnetic flux density higher than that of which the magnetic pole main layer 19 is made, specifically an iron alloy or the like. The iron alloy here, for instance, includes an iron-nickel alloy (FeNi), an iron-cobalt alloy (FeCo) or an iron-cobalt-nickel alloy (FeCoNi), all rich in iron (Fe).

It is noted that the aforesaid "coupled" would mean just only a coupling involving physical contact but also a coupling involving physical contact plus a magnetically conductive coupling.

As shown in FIG. 6, for instance, the main magnetic pole 15 is configured in a generally battledore type planar shape. To be more specific, the main magnetic pole 15 comprises, in order from the air bearing surface 70, a front end 15A that extends rearward from that air bearing surface 70 and having a constant width W1 for defining the recording track width of the recording medium and a rear end 15B that is linked to the rear of that front end 15A and having a width W4 greater than the width W1 (W4>W1). The position at which the width of the main magnetic pole 15 starts growing wide from the front end 15A (of width W1) toward the rear end 15B (of width W4) is a "flare point FP" that is one of important determinants for the recording performance of the thin-film head. Note here that the main magnetic pole 15 may contact the magnetic pole main layer 19 from its bottom (substrate side) alone, thereby linking magnetically to it.

The front end 15A is primarily adapted to substantially release a recording magnetic flux produced at the thin-film coil 22 toward the recording medium, and has an exposed surface 15M exposed on the air bearing surface 70, as shown in FIG. 6.

As shown typically in FIG. 7, the exposed surface 15M takes a planar shape defined by an upper end edge (one end edge) E1 positioned on the trailing side, a lower end edge (another end edge) E2 positioned on the leading side, and two side end edges S1 and S2. To be more specific, the exposed surface 15M typically assumes on a trapezoidal shape with its width becoming gradually narrow from the trailing side toward the leading side (W1>W3). The trailing edge T1 of the front end 15A provides a substantial recording site of the magnetic pole layer 40.

The rear end 15B shown in FIG. 6 is adapted to receive the magnetic flux received in the magnetic pole main layer 19 and feed it to the front end 15A. Typically, the width of this rear end 15B remains constant (width W4) in the rear, and becomes gradually narrow from width W4 to width W1 in the front as the front end 15A comes near.

The magnetic pole main layer 19 functions as a portion adapted to receive a dominant magnetic flux.

Typically, this magnetic pole main layer 19 extends rearward from a position P1 (the first position) receded from the air bearing surface 70. To be more specific, it extends as far as the rear of the main magnetic pole 15 at the back gap 50BG, and has a thickness of typically about 0.45 µm. In particular, the magnetic pole main layer 19 is made of a magnetic material having a saturation magnetic flux density lower than that forming the main magnetic pole 15, preferably, an iron-cobalt-nickel alloy.

As shown typically in FIG. 6, the magnetic pole main layer 19 has a rectangular planar shape of width W4. In the magnetic pole main layer 19 in particular, both an auxiliary insulating layer 20 of the insulating layer 50 to be described later and a TH defining layer 18 of the write shield layer 60 to be described later are flattened. That is, the end face of the magnetic pole main layer 19 on the trailing side forms a flat plane HM together with the end face of the auxiliary insulating layer 20 on the trailing side and the end face of the TH defining layer 18 on the trailing side.

The insulating layer 16 is provided to isolate the main magnetic pole 15 electrically from the surroundings. This insulating layer 16 is made of a nonmagnetic insulating material such as alumina, and has a thickness of typically about 0.25 µm.

The gap layer 17 is formed in such a way as to provide a gap for the magnetic separation of the magnetic layer 40 from the write shield layer 60. As typically shown in FIG. 5, the gap layer 17 extends rearward from the air bearing surface 70 along the main magnetic pole 15 except an area with the magnetic pole main layer 19 located on it. In particular, the gap layer 17 is made of a nonmagnetic insulating material such as alumina or a nonmagnetic electroconductive material such as ruthenium, and has a thickness of typically about 0.03 to 0.1 µm.

The insulating layer 50 defines the throat height TH that is one of important determinants for the recording performance of the thin-film magnetic head, and is adapted to cover the thin-film coil 22 in such a way as to isolate it electrically from the surroundings. As shown in FIG. 5, the insulating layer 50 has a structure wherein an auxiliary insulating layer 20 (the first insulating layer portion) formed in such a way as to substantially define the throat height TH and a main insulating layer 21 (the second insulating layer portion) formed in such a way as to substantially cover the thin-film coil 22 are stacked one upon another in that order. It follows that there is a multilayer (double-layer) structure involved, wherein the auxiliary insulating layer 20 is located on the leading side and the main insulating layer 21 is located on the trailing side.

As shown in FIG. 5, the auxiliary insulating layer 20 extends along the gap layer 17 and from a position receded from the air bearing surface 70, viz., a position P2 (the second position) between the air bearing surface 70 and a position P1 to the position P1 in the rear. And, the auxiliary insulating layer 20 is provided in such a way as to be adjacent to the magnetic pole main layer 19 at the position P1, and adjacent to the write shield layer 60 (the TH defining layer 18 to be described later) at the position P2. In the embodiment here in particular, the auxiliary insulating layer 20 defines a flat plane HM together with the magnetic pole main layer 19 and TH defining layer 18.

The aforesaid "position P2" is corresponding to the foremost end position of the insulating layer 50 (nearest to the air bearing surface 70). That is, there is a "zero throat height position TP" for defining the throat height TH. That throat height TH is a distance between the air bearing surface 70 and the zero throat height position TP. This auxiliary insulating layer 20 is made of a nonmagnetic insulating material such as alumina. In the embodiment shown in FIGS. 5 and 6, the zero throat height position TP is in coincidence with the flare point FP.

As shown in FIG. 5, the main insulating layer 21 extends rearward from a position P3 (the third position) between the positions P1 and P2 while lying along the flat plane HM of the auxiliary insulating layer 20. More specifically, the main insulating layer 21 extends in such a way as not to fill up the back gap 50BG, and is receded from the auxiliary insulating layer 20. As shown typically in FIG. 5, this main insulating layer 21 comprises a main insulating layer portion 21A that is located as an underlay of the thin-film coil 22 on the flat plane HM of the auxiliary insulating layer 20, and a main insulating layer portion 21B that is located in such a way as to cover the thin-film coil 22 and the main insulating layer portion 21A around it.

The main insulating layer portion 21A is made of a non-magnetic material such as alumina, and has a thickness of typically about 0.2 μm.

The main insulating layer portion 21B is made of a non-magnetic insulating material such as a photoresist or spin-on-glass (SOG) that exhibits fluidity upon heating. A portion of this main insulating layer portion 21B at and near its end edge is in such a rounded slant shape as to fall away toward that end edge.

The thin-film coil 22 is formed for the generation of a recording magnetic flux. For instance, the thin-film coil 22 operates such that currents flow in the direction opposite to the direction taken by currents through the aforesaid thin-film coil 10.

The write shield layer 60 works capturing the spreading component of a recording magnetic flux released off the magnetic pole layer 40, thereby holding back the spreading of that magnetic flux. Located on the trailing side of the main magnetic pole layer 40 and thin-film coil 22, the write shield layer 60 extends rearward from the air bearing surface 70, whereby it is spaced by the gap film 17 away from the magnetic pole layer 20 on its side near to the air bearing surface 70, and linked to the magnetic layer 40 through the back gap 50BG in its side far away from the air bearing surface 70.

The write shield layer 60 here comprises the TH defining layer 18 (the first magnetic shield layer portion) and a yoke layer 23 (the second magnetic shield layer portion) that are separate from each other, and has a structure wherein the TH defining layer 18 and yoke layer 23 are coupled to each other. It is here noted that the write shield layer 60 is not limited to the coupled structure as shown; it may be an integral structure.

The TH defining layer 18 functions as a dominant magnetic flux inlet port adapted to capture an extra portion of the magnetic flux released directly from the magnetic pole. As shown typically in FIG. 5, this TH defining layer 18 extends from the air bearing surface 70 as far as a position in the rear, more specifically, as far as the position P2 in front of the position P1 while lying adjacent to the gap layer 17, so that at that position P2 it lies adjacent to the auxiliary insulating layer 20 of the insulating layer 50.

The TH defining layer 18 is made of a magnetic material having a high saturation flux density such as permalloy or iron alloys, and assumes on a rectangular planar shape having a width W5 larger than the width W4 of the main magnetic pole layer 40 (W5>W4), as shown in FIG. 6. In particular, the TH defining layer 18 forms the flat plane HM together with the magnetic pole main layer 19 and auxiliary insulating layer 20, as typically described above. In other words, the end face of the TH defining layer 18 on the trailing side forms the flat plane HM together with both the end face of the magnetic pole main layer 19 on the trailing side and the end face of the auxiliary insulating layer 20 on the trailing side. The TH defining layer 18 lies adjacent to the auxiliary insulating layer 20 at the position P2 as described above; that is, the TH defining layer 18 takes a substantial role of defining the foremost end position of the insulating layer 50 (the zero throat height position TH), thereby defining the throat height TH.

The yoke layer 23 is set up in such a way as to function as a passage for the magnetic flux captured out of the TH defining layer 18, and function as a return yoke for allowing the magnetic flux to go back from the lining layer of the medium. As shown typically in FIG. 5, the yoke layer 23 goes over the TH defining layer 18, extending at least as far as the back gap 50BG from the air bearing surface 70 via on the insulating layer 50. In other words, in the front, there is the yoke layer 23 going over the TH defining layer 18 and linked to it, and in the rear, there is the yoke layer 23 lying adjacent to the main magnetic pole layer 40 through the back gap 50BG and linked to it.

In the embodiment here, for instance, the yoke layer 23 extends as far as the rear of the back gap 50BG while linked to the main magnetic pole layer 40 at the back gap 50BG. Such yoke layer 23, for instance, is made of a magnetic material similar to that of which the TH defining layer 18 is made, and takes a rectangular planar shape having a width W5 as shown in FIG. 6.

For such a thin-film magnetic head as described above, it is desired that constant dimensions defined on the basis of a specific component element be optimized to make sure recording performance, as typically shown in FIG. 5. More specifically, the distance of the auxiliary magnetic pole 19 receded from the air bearing surface 70, viz., the distance L1 between the air bearing surface 70 and the position P1 should preferably be 0.8 to 7.1 μm. The distance of the main insulating layer 21 receded from the air bearing surface 70, viz., the distance L3 between the air bearing surface 70 and the position P3 should be greater than the length of the TH defining layer 18, viz., the distance L2 between the air bearing surface 70 and the position P2 (L3>L2). In consideration of the structural relation where the distance L3 is greater than the distance L2, the write shield layer 60 is designed such that the length of a portion of the yoke layer 23 adjacent to the TH defining layer 18 (viz., the distance L3) is greater than the length of the TH defining layer (viz., the distance L2). In other words, when the magnetic flux is captured in the yoke layer 23 of the write shield layer 60 via the TH defining layer 18, the magnetic path taken by that magnetic flux flowing through the write shield layer 60 is incrementally expanded.

It is here noted that the whole structure of the thin-film magnetic head as described above is never limited to that described above, and so may be modified in various ways.

Such a thin-film magnetic head may mainly be fabricated by forming and stacking together component elements using existing thin-film processes inclusive of film-formation techniques as represented by plating or sputtering, patterning techniques as represented by photo-lithography, and etching techniques as represented by drying etching or wet etching.

(Explanation of How the Thin-Film Magnetic Head Works)

How the thin-film magnetic head according to the embodiment here works is now explained. The thin-film magnetic head records information in the recording medium by the recording head, and plays back the information recorded in the recording medium by the reproducing head.

At the reproducing head, the direction of a bias magnetic field applied by the bias magnetic field-applying layers 106 is orthogonal to a direction perpendicular to the medium opposite plane 70 (ABS 70). At the CPP-GMR device 500 with no signal magnetic field applied yet, the magnetization direction of the free layer 150 lies in the direction of the bias magnetic field, and the magnetization direction of the fixed magnetization layer 130 is fixed in a direction perpendicular to the medium opposite plane 70 (ABS 70).

At the CPP-GMR device 500, there is a change in the magnetization direction of the free layer 150 depending on a signal magnetic field from the recording medium, which in turn causes a change in the relative angle between the magnetization direction of the free layer 150 and the magnetization direction of the fixed magnetization layer 130, with the result that there is a change in the resistance value of the CPP-GMR device 500. The resistance value of the CPP-GMR device 500 may be found from a potential difference between the first and second shield layers, i.e., the two electrode layers 3 and 5 at the time when a sense current is passed through the MR device. It is thus possible for the reproducing head to play back the information recorded in the recording medium.

[Explanation of the Head Gimbal Assembly and the Hard Disk System]

One example of the head gimbal assembly or the hard disk system, with the foregoing thin-film head mounted on it, is now explained.

A slider 210 included in the head gimbal assembly is first explained with reference to FIG. 8. In the hard disk system, the slider 210 is located in such a way as to face a hard disk that is a rotationally driven disk-form recording medium. This slider 210 primarily comprises a substrate 211 built up of a substrate and overcoat.

The substrate 211 is in a generally hexahedral shape. Of the six surfaces of the substrate 211, one surface is in opposition to the hard disk. On that one surface there is the air bearing surface 30 formed.

Figure 8:
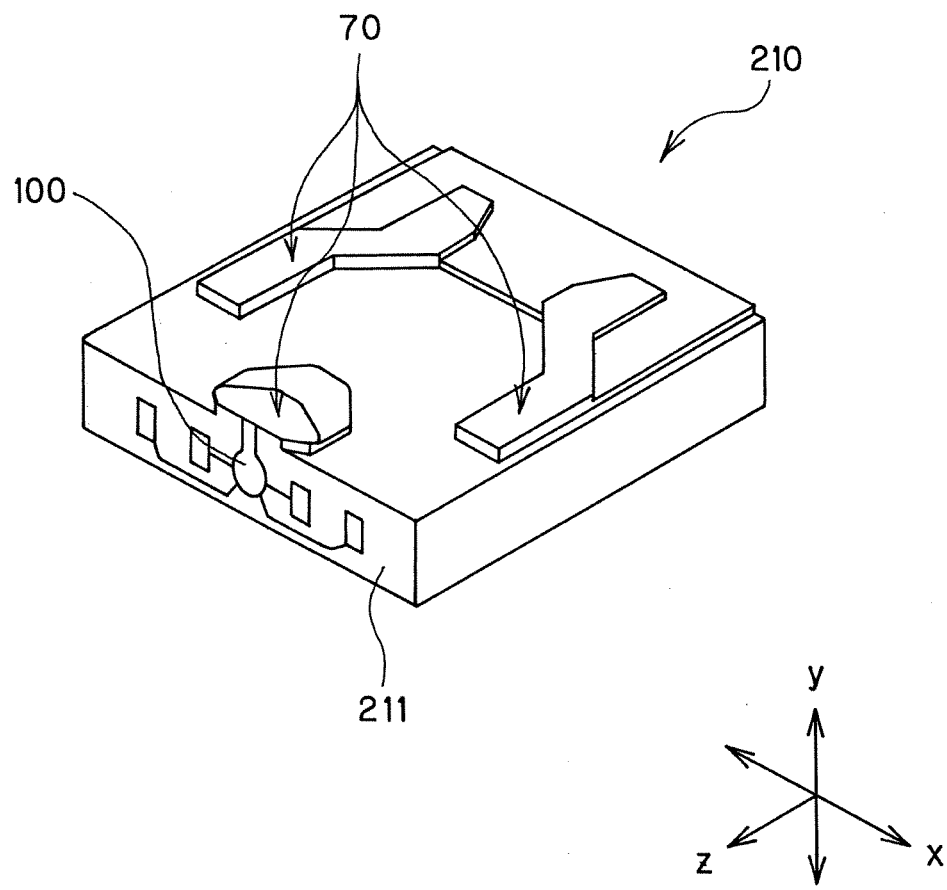
FIG. 8 is a perspective view of a slider built in the head gimbal assembly according to one embodiment of the invention.

As the hard disk rotates in the z-direction in FIG. 8, it causes an air flow passing between the hard disk and the slider 210 to induce lift relative to the slider 210 in the downward y-direction in FIG. 8. This lift in turn causes the slider 210 to levitate over the surface of the hard disk. Note here that the x direction in FIG. 8 traverses tracks on the hard disk.

Near the end of the slider 210 on an air exit side (the left lower end in FIG. 8), there is the thin-film magnetic head formed according to the embodiment here.

A head gimbal assembly 220 according to this embodiment is now explained with reference to FIG. 9. The head gimbal assembly 220 comprises a slider 210 and a suspension 221 adapted to resiliently support that slider 210. The suspension 221 comprises a leaf spring-form load beam 222 made of typically stainless steel, a flexure 223 attached to one end of the load beam 222 and having the slider 210 joined to it for giving a suitable degree of flexibility to the slider 210, and a base plate 224 attached to the other end of the load beam 222.

The base plate 224 is adapted to be attached to an arm 230 of an actuator for moving the slider 210 in the track traverse direction x of the hard disk 262. The actuator comprises the arm 230 and a voice coil motor for driving that arm 230. At a portion of the flexure 223 having the slider 210 attached to it, there is a gimbal portion provided for keeping the posture of the slider 210 constant.

The head gimbal assembly 220 is attached to the arm 230 of the actuator. The head gimbal assembly 220 attached to one arm 230 is called a head arm assembly, whereas the head gimbal assembly 220 attached to a carriage at its plurality of arms is referred to as a head stack assembly.

Figure 9:
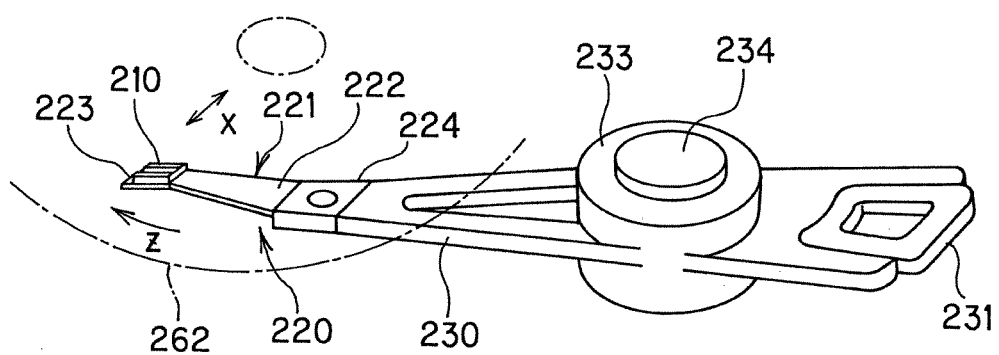
FIG. 9 is a perspective view of a head arm assembly including the head gimbal assembly according to one embodiment of the invention.

FIG. 9 illustrates one example of the head arm assembly, wherein the head gimbal assembly 220 is attached to one end of the arm 230. To the other end of the arm 230, a coil 231 forming a part of the voice coil motor is attached. Halfway across the arm 230, there is a bearing portion 233 attached to a shaft 234 adapted to support the arm 230 in a pivotal fashion.

One each example of the head stack assembly and the hard disk system according to the embodiment here are now explained with reference to FIGS. 10 and 11.

Figure 10:
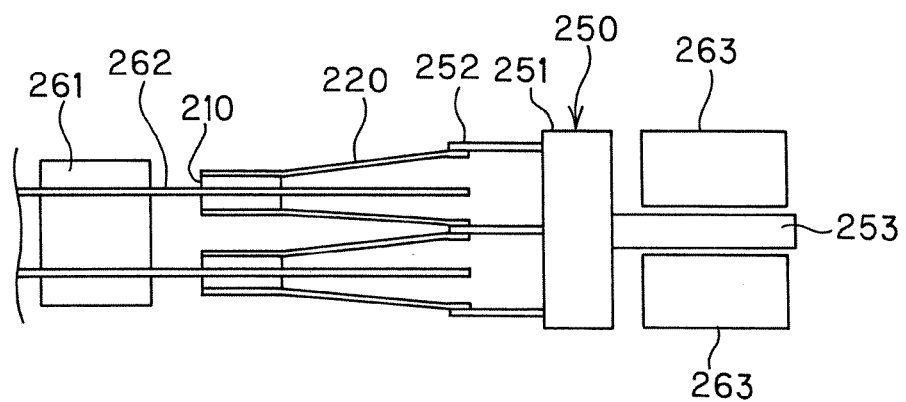
FIG. 10 is illustrative of part of the hard disk system according to one embodiment of the invention.
Figure 11:
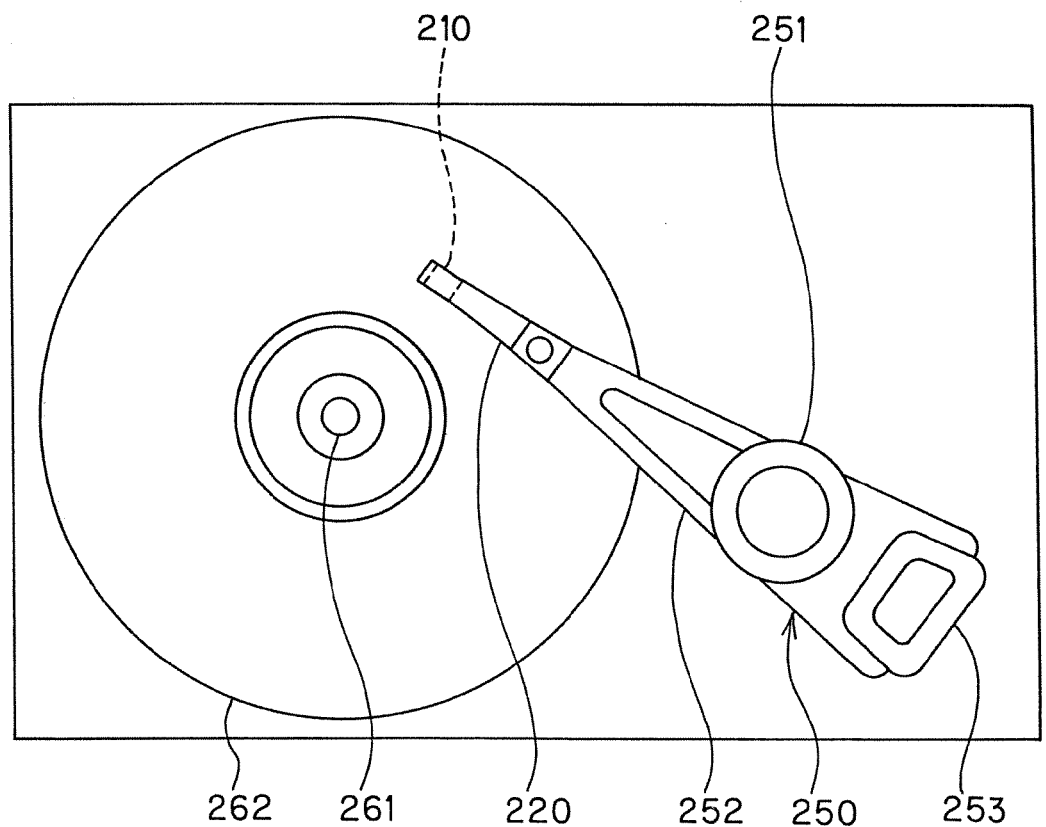
FIG. 11 is a plan view of the hard disk system according to one embodiment of the invention.

FIG. 10 is illustrative of part of the hard disk system, and FIG. 11 is a plan view of the hard disk system.

A head stack assembly 250 comprises a carriage 251 having a plurality of arms 252. The plurality of arms 252 are provided with a plurality of the head gimbal assemblies 220 such that they line up perpendicularly at an interval. On the side of the carriage 251 that faces away from the arms 252, there is a coil 253 attached, which coil becomes a part of the voice coil motor. The head stack assembly 250 is incorporated in the hard disk system.

The hard disk system comprises a plurality of hard disks 262 attached to a spindle motor 261. For each hard disk 262, two sliders 210 are located such that they are opposite to each other with the hard disk 262 held between them. The voice coil motor has also permanent magnets 263 located at opposite positions with the coil 253 of the head stack assembly 250 held between them.

The head stack assembly 250 except the slider 210 and the actuator correspond to the positioning device here which is operable to support the slider 210 and position it relative to the hard disk 262.

With the hard disk system here, the actuator is actuated to move the slider 210 in the track traverse direction of the hard disk 262, thereby positioning the slider 210 with respect to the hard disk 262. The thin-film magnetic head incorporated in the slider 210 works such that information is recorded by a recording head in the hard disk 262, and the information recorded in the hard disk 262 is played back by a reproducing head.

The head gimbal assembly and the magnetic disk system here have pretty much the same action as the thin-film magnetic head according to the foregoing embodiment.

While the embodiment here has been described with reference to the thin-film magnetic head of the structure wherein the reproducing head is located on the substrate side and the recording head is stacked on the reproducing head, it is contemplated that that order of stacking could be reversed. When the thin-film magnetic head here is used as a read-only head, the recording head could be removed from it.

EXPLANATION OF THE SPECIFIC EXPERIMENTATION EXAMPLES

The CPP-GMR device 500 as described above is now explained in more details with reference to the following specific experimental examples.

Experimental Example 1

A CPP-GMR device unit having the spacer layer 140 of a triple-layer structure of Cu (141)/semiconductor oxide layer (142)/Cu (143) shown in Table 1, given below, was provided by the successive sputtering of them on the lower electrode layer 3 made of NiFe. It is here found that the spacer layer 140 of the triple-layer structure of Cu (141)/semiconductor oxide layer (142)/Zn (143), too, produced much the same effect as in the invention of this application as described below.

TABLE 1

| Multilayer Structure | | Layer Material | Thickness (nm) |
|---|---|---|---|
| Protective Layer (126) | | Ru | 2.0 |
| Free Layer | | CoFe | 4.0 |
| Spacer Layer (140) | $2^{nd}$ Nonmagnetic Metal Layer (143) | Cu | 0.7 |
| | Semiconductor Oxide Layer (142) | (ZnO, $In_2O_3$, or $SnO_2$) | 1.6 |
| | $1^{st}$ Nonmagnetic Metal Layer (141) | Cu | 0.7 |
| Fixed Magnetization Layer (130) | Inner Layer (133) | CoFe | 3.5 |
| | Nonmagnetic Intermediate Layer (132) | Ru | 0.7 |
| | Outer Layer (131) | CoFe | 3.0 |
| Antiferromagnetic Layer (122) | | IrMn | 5.0 |
| Underlay Layer (121) | | NiCr | 4.0 |

For the preparation of specific samples, the device unit in Table 1 was formed, followed by heat treatment at 270% for 3 hours, by which the semiconductor oxide layer 142 was crystallized to lower its resistance.

Subsequently, the aforesaid device unit was processed into a columnar shape of 100×100 nm, the interface protective layer 105 that contained a nitrogen element and had a thickness of 3 nm was formed on its side, and the insulating layer 104 made of $Al_2O_3$ was then covered over the interface protective layer 105 at a thickness of about 30 nm to make sure its insulating function. Finally, the upper electrode layer 5 made of NiFe was formed on the device, thereby preparing the CPP-GMR device sample 500.

For the semiconductor oxide layer 142, ZnO, $In_2O_3$, and $SnO_2$ was used, respectively, as also shown in Table 1. For the interface protective layer 105, SiON, AlON, and BON was used, respectively. The samples were prepared at varied nitrogen (N) concentrations (at % in the anions).

Each of the thus prepared device samples 500 was measured for its standardized resistance Ran in the following manner.

Standardized Resistance Ran

The resistance of each device sample was measured in its initial state just after the insulating layer 104 was formed. This value is designated as the initial device resistance R1.

Then, the resistance of the device was measured after annealing at 270° C. for 3 hours. This measurement is designated as the device resistance R2 after the heat treatment.

The standardized resistance Ran is defined by the following equation (1).

$$Ran = R2/R1 \qquad \text{Eq. (1)}$$

Eq. (1) means that the closer the value of Ran gets to 1, the better the heat resistance of the device and the better the stability of the device to heat.

For the CPP-GMR devices obtained by using ZnO, $In_2O_3$, and $SnO_2$ as the semiconductor oxide layer 142, respectively, and SiON as the interface protective layer 105, how the value of Ran changed was measured at varied nitrogen atom % of the interface protective layer 105. The results are plotted in the graph of FIG. 12, with the value of the standardized resistance Ran as ordinate and as abscissa the content (at %) of nitrogen atoms in the anions forming the interface protective layer 105 (i.e., N+O). The respective parameters are ZnO, $In_2O_3$, and $SnO_2$ as the semiconductor oxide layer 142.

Figure 12:
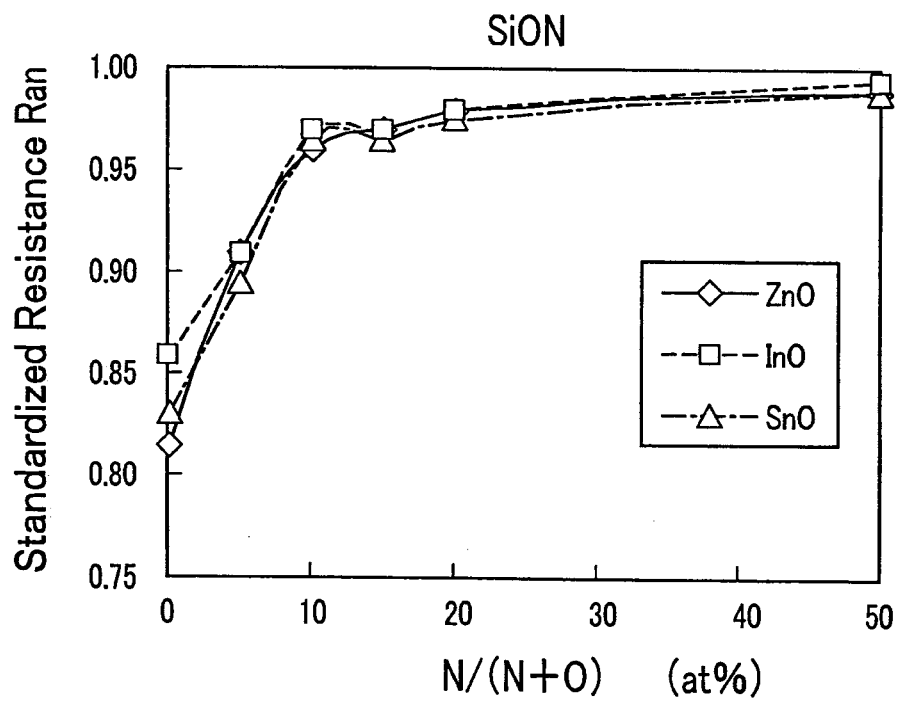
FIG. 12 is a graph indicative of the relationship between the standardized resistance Ran and the content of nitrogen in the SiON interface protective layer after the heat treatment of a device sample.

From the results plotted in the graph of FIG. 12, it is appreciated that if the content of nitrogen atoms in the anions forming the interface protective layer 105 is greater than 10 at %, there are resistance fluctuations of less than 5% obtained irrespective of what the semiconductor oxide layer 142 was made of. If the resistance fluctuations are within 5%, fluctuations of the device characteristics and deterioration over time of them due to heat and stress in the process can be well held back, as will be detailed later.

Figure 13:
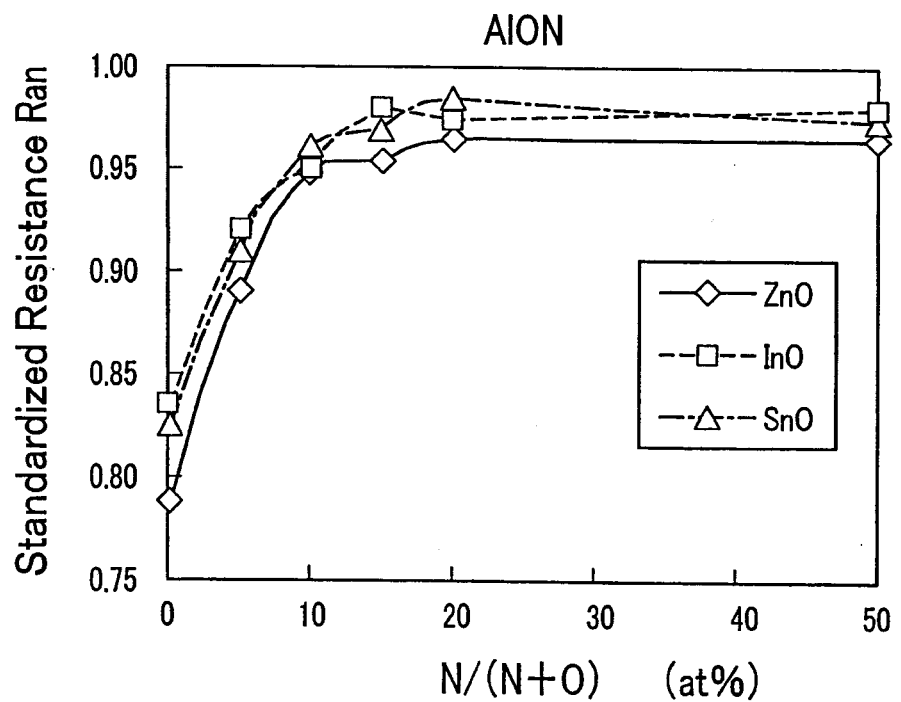
FIG. 13 is a graph indicative of the relationship between the standardized resistance Ran and the content of nitrogen in the AlON interface protective layer after the heat treatment of a device sample.
Figure 14:
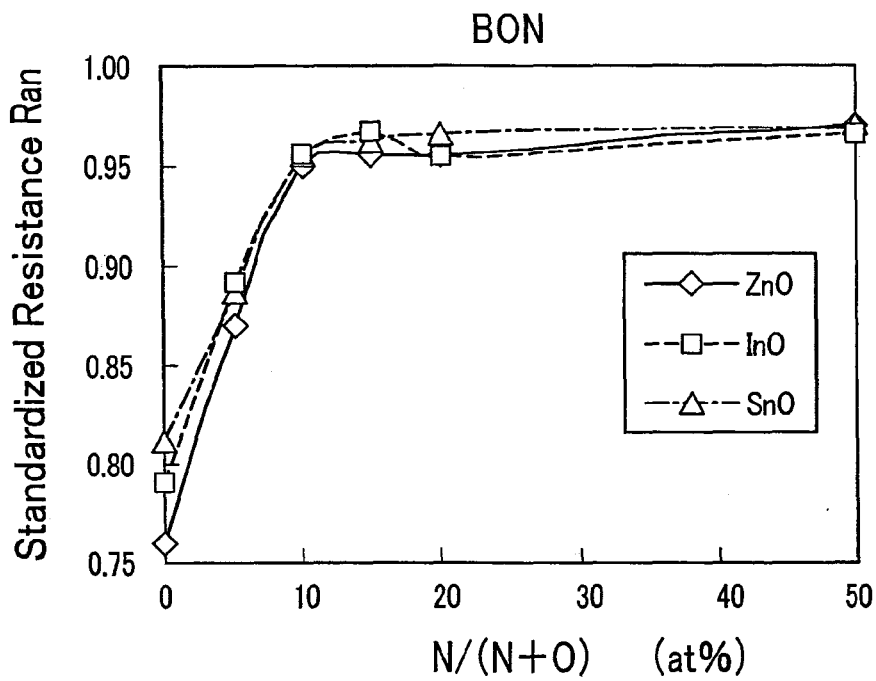
FIG. 14 is a graph indicative of the relationship between the standardized resistance Ran and the content of nitrogen in the BON interface protective layer after the heat treatment of a device sample.

The results of experiments using AlON and BON as the interface protective layer 105, respectively, in the same manner are shown in FIGS. 13 and 14, respectively.

From the results plotted in the graph of FIGS. 13 and 14, it is appreciated that if the content of nitrogen atoms in the anions forming the interface protective layer 105 is greater than 10 at %, the resistance fluctuations are kept low irrespective of what the semiconductor oxide layer 142 was made of.

Experimental Example II

Such experiments as described below were carried out to learn what is the thermal stability of the aforesaid Experimental Example I caused by, and what phenomenon occurs at the interface of the end of the semiconductor oxide layer 142.

Experiment II-1

In an actual device state, the zone (area) at which the semiconductor oxide layer 142 contacts the interface protective layer 105 is too small to obtain any direct observation of it. For that reason, the semiconductor oxide layer 142 made of ZnO was first formed, and the interface protective layer 105 made of SiN was then formed on it into a double-layer sample. SIMS (secondary ion mass spectroscopy) measurements were obtained from the upper SiN layer side to figure out an element concentration profile in the depth direction of the double-layer structure.

Figure 15:
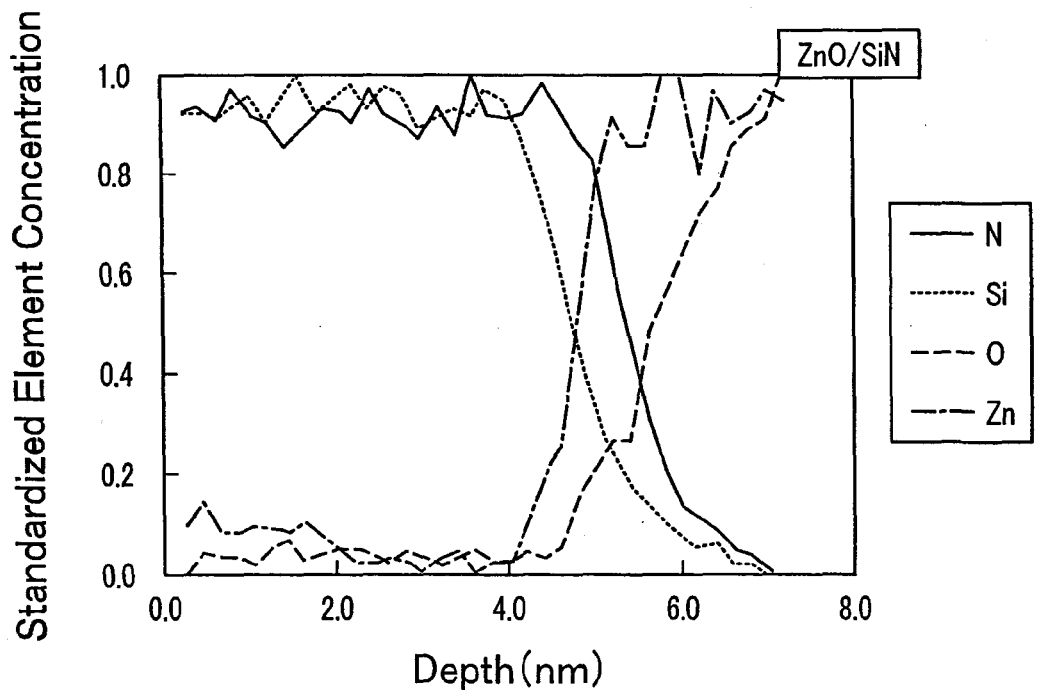
FIG. 15 is a graph indicative of the SIMS profile of a ZnO/SiN interface.

The results are plotted in the graph of FIG. 15 with the value of the standardized element concentration as ordinate and the depth in nm of the double-layer structure (ZnO (lower)/SiN (upper)) from the upper layer as abscissa. The standardized element concentration here is understood to refer to a value with the maximum and minimum values of a detected waveform at each element as 1 and 0, respectively, because detection intensities differ for each element.

As appreciated from the graph of FIG. 15, the SIMS measurements were obtained with four elements Zn, O, Si, and N and standardization was carried out for all the profiles. In initial measurements, the components Si and N of the upper SiN were detected, respectively, but neither Zn nor O was detected. As ion milling reaches the SiN/ZnO interface, Zn and O start to be measured, but Zn is detected a little earlier than O (corresponding to 0.5 nm as calculated as thickness). At the same time, the amount of the detected Si and N decreases; however, Si starts to decrease earlier than N, resulting in N making its way deeper into the film than Si.

Considering what goes on near the interface with these results overall in mind, ZnN of about 0.5 nm would be formed at the SiN/ZnO interface.

(Experimentation for Making Certain the Aforesaid Considerations Through the Preparation of a Comparative Sample)

To make certain such considerations, a comparative double-layer sample was prepared by forming a Si layer on the semiconductor oxide layer 142 made of ZnO. SIMS (secondary ion mass spectroscopy) measurements were obtained from the upper Si layer side to figure out an element concentration profile in the depth direction of the double-layer structure.

Figure 16:
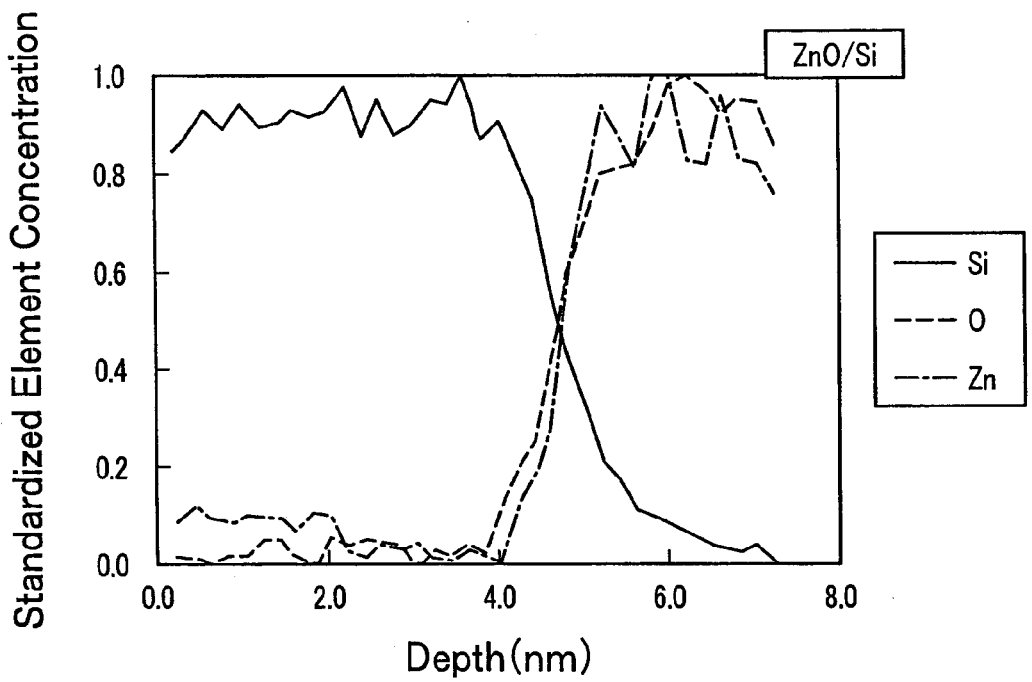
FIG. 16 is a graph indicative of the SIMS profile of a ZnO/Si interface.

The results for comparison are plotted in the graph of FIG. 16 with the value of the standardized element concentration value as ordinate and the depth in nm of the double-layer structure (ZnO (lower)/Si (upper)) from the upper layer as abscissa. As can be seen from the graph of FIG. 16, the upper layer is composed only of Si with none of Ni: Zn and O appear at the same position. It is thus suggested that ZnO exits as far as near the interface.

Experiment II-2

With a multilayer film sample where the SiN used in the aforesaid Experiment II-1 was changed to SiON (N/(N+0)= 10 at %) having a device resistance fluctuation Ran (=standardized resistance Ran) of greater than 0.95, SIMS measurement experimentation was carried out in the same way as in the aforesaid experiment II-1.

Figure 17:
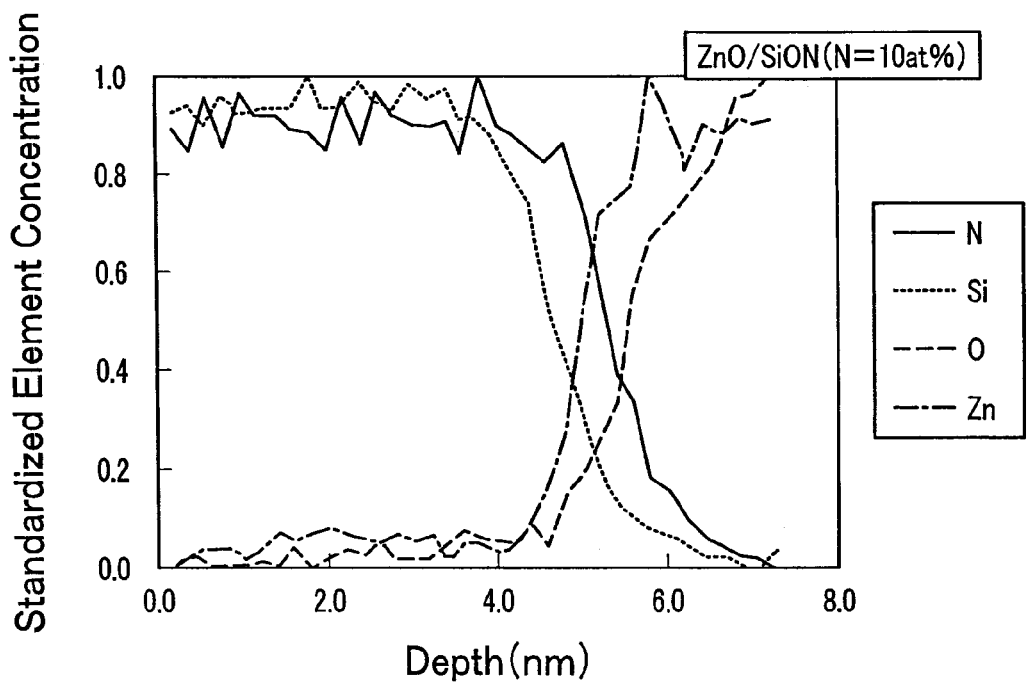
FIG. 17 is a graph indicative of the SIMS profile of a ZnO/SiON interface.

The results are plotted in the graph of FIG. 17. As can be seen from the graph of FIG. 17, that the profile of that multilayer film is similar to that of ZnO/SiN suggests that ZnN is again formed on the interface.

ZnN is higher in the covalent bonding capability and more stable than ZnO. This ZnN is formed at the ZnO/SiON (SiN) interface: the diffusion of oxygen from ZnO to outside would be inhibited. Note here that ZnN itself is a material classified as a semiconductor: using it as an insulating layer by itself is difficult from the standpoint of setting up reliable insulation. Therefore, the arrangement where the conventional insulating layer 104 is used as such and the interface protective layer 105 is interposed between the insulating layer 104 and the semiconductor oxide layer 142 is very favorable, as in the invention of this application.

Experiment II-3

With a multilayer film sample where the SiN used in the aforesaid Experiment II-1 was changed to AlON (N/(N+0)= 10 at %) having a device resistance fluctuation Ran of greater than 0.95, SIMS measurement experimentation was carried out in the same way as in the aforesaid experiment II-1.

Figure 18:
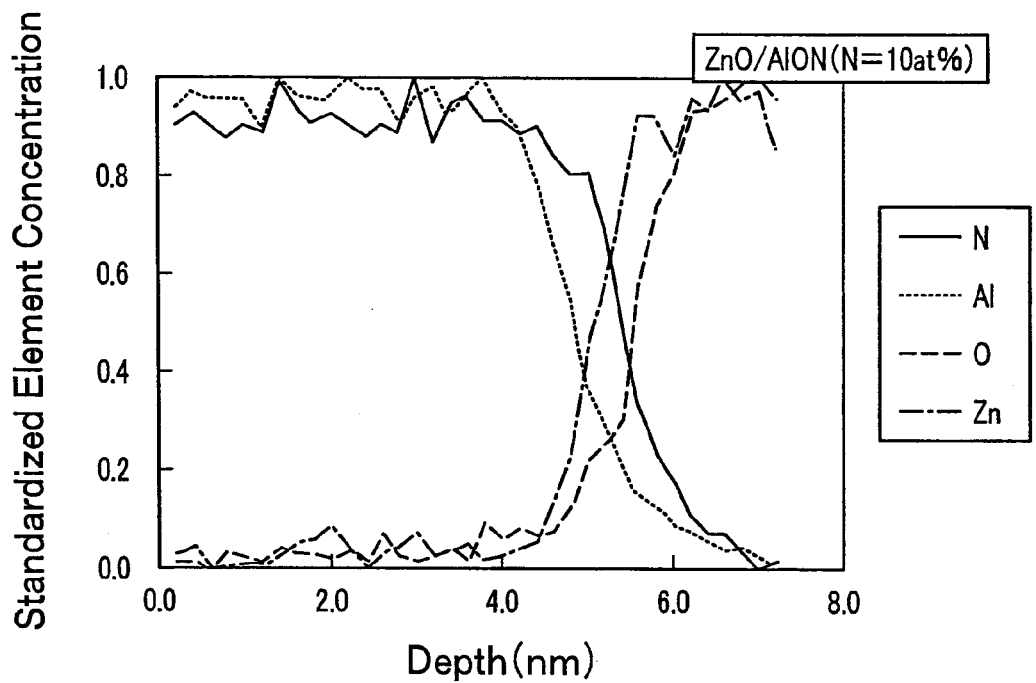
FIG. 18 is a graph indicative of the SIMS profile of a ZnO/AlON interface.

The results are plotted in the graph of FIG. 18. As can be seen from the graph of FIG. 18, that the profile of that multilayer film is similar to that of ZnO/SiN suggests that ZnN is again formed on the interface.

Experiment II-4

With a multilayer film sample where the SiN used in the aforesaid Experiment II-1 was changed to BON (N/(N+0)=10 at %) having a device resistance fluctuation Ran of greater than 0.95, SIMS measurement experimentation was carried out in the same way as in the aforesaid experiment II-1.

Figure 19:
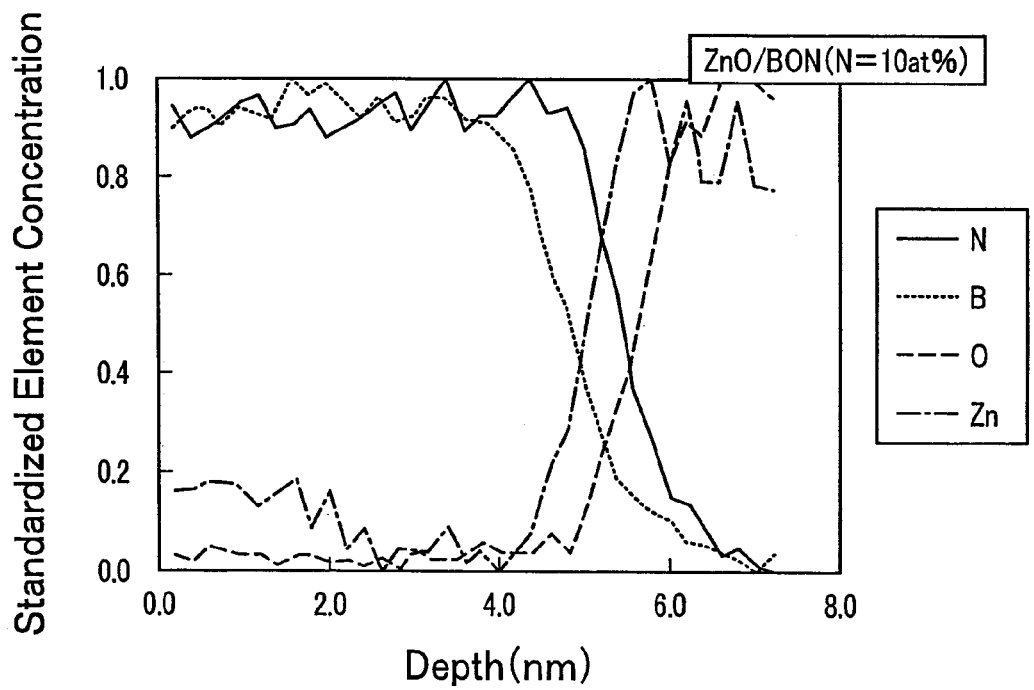
FIG. 19 is a graph indicative of the SIMS profile of a ZnO/BON interface.

The results are plotted in the graph of FIG. 19. As can be seen from the graph of FIG. 19, that the profile of that multilayer film is similar to that of ZnO/SiN suggests that ZnN is again formed on the interface.

Experiment II-5

With a multilayer film sample where the SiN used in the aforesaid Experiment II-1 was changed to SiON (N/(N+0)= 10 at %) having a device resistance fluctuation Ran of greater than 0.95, and ZnO used in the aforesaid Experiment II-1 was changed to $In_2O_3$, SIMS measurement experimentation was carried out in the same way as in the aforesaid experiment II-1.

Figure 20:
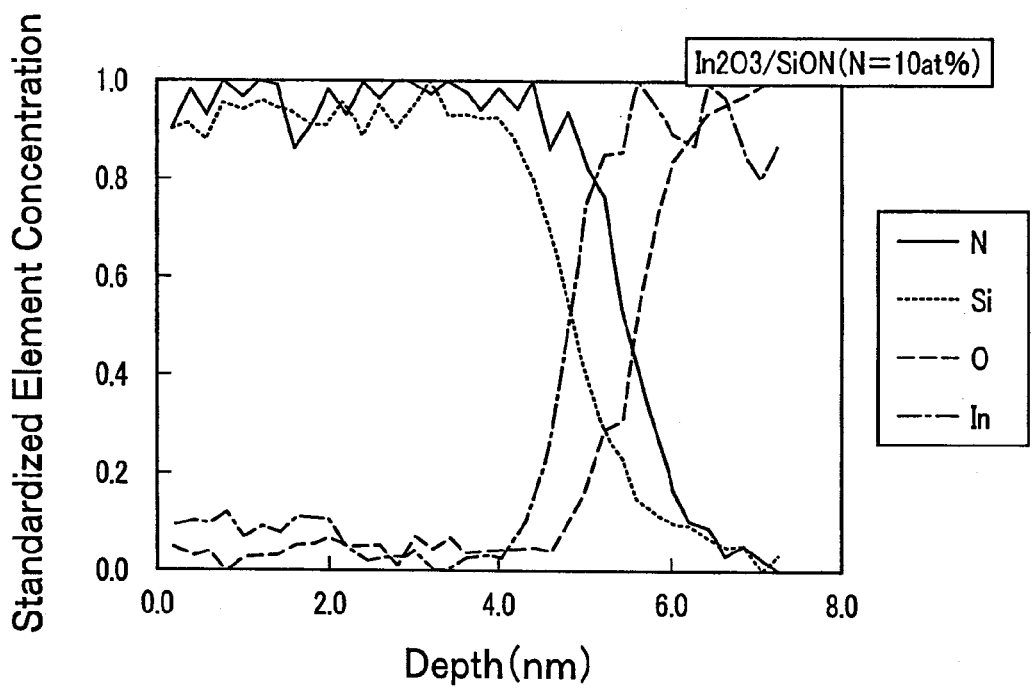
FIG. 20 is a graph indicative of the SIMS profile of a $In_2O_3$/SiON interface.

The results are plotted in the graph of FIG. 20. As can be seen from the graph of FIG. 20, that the profile of that multilayer film is similar to that of ZnO/SiN suggests that ZnN is again formed on the interface.

Experiment II-6

With a multilayer film sample where the SiN used in the aforesaid Experiment II-1 was changed to SiON (N/(N+0)= 10 at %) having a device resistance fluctuation Ran of greater than 0.95, and ZnO used in the aforesaid Experiment II-1 was changed to $SnO_2$, SIMS measurement experimentation was carried out in the same way as in the aforesaid experiment II-1.

Figure 21:
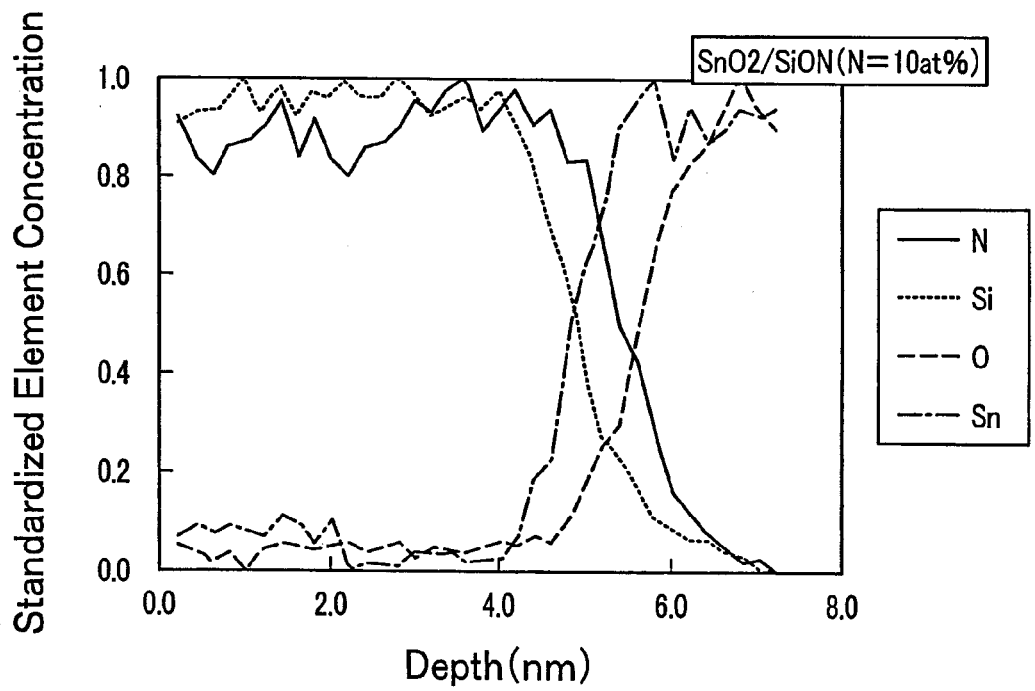
FIG. 21 is a graph indicative of the SIMS profile of a $SnO_2$/AlON interface.

The results are plotted in the graph of FIG. 21. As can be seen from the graph of FIG. 21, that the profile of that multilayer film is similar to that of ZnO/SiN suggests that ZnN is again formed on the interface.

Experimental Example III

To figure out the needed thickness of the N-containing interface protective layer, such experimentation as described below was conducted.

CPP-GMR device samples were prepared as in the aforesaid Experimental Example 1, but the thickness of the nitrogen element-containing interface protective layer 105 was changed to 0.3 nm, 0.5 nm, 1.0 nm, and 3.0 nm, respectively. The thickness of the $Al_2O_3$ insulating layer 104 formed on such interface protective layer 105 was kept constant at 3 nm.

Experiment III-1

Figure 22:
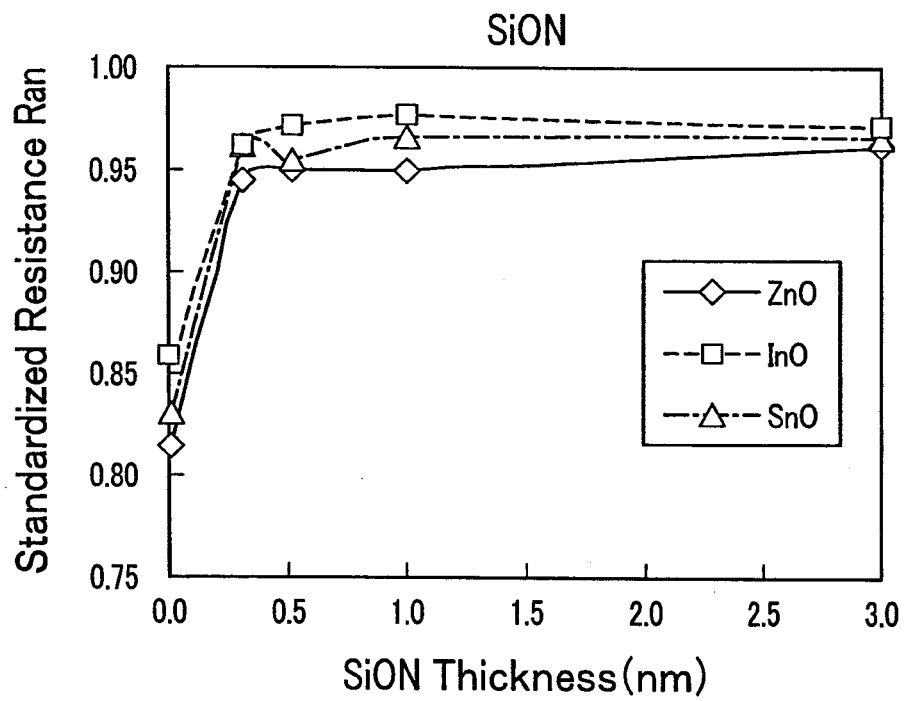
FIG. 22 is a graph indicative of the dependency of the thickness of SiON on resistance changes.

The results of experimentation where the interface protective layer 105 was made of SiON(N/(N+O)=10 at %) are plotted in the graph of FIG. 22, with the value of the standardized resistance Ran as ordinate and the thickness in nm of SiON—the interface protective layer 105—as abscissa. The respective parameters are ZnO, $In_2O_3$, and $SnO_2$ as the semiconductor oxide layer 142.

Experiment III-2

Figure 23:
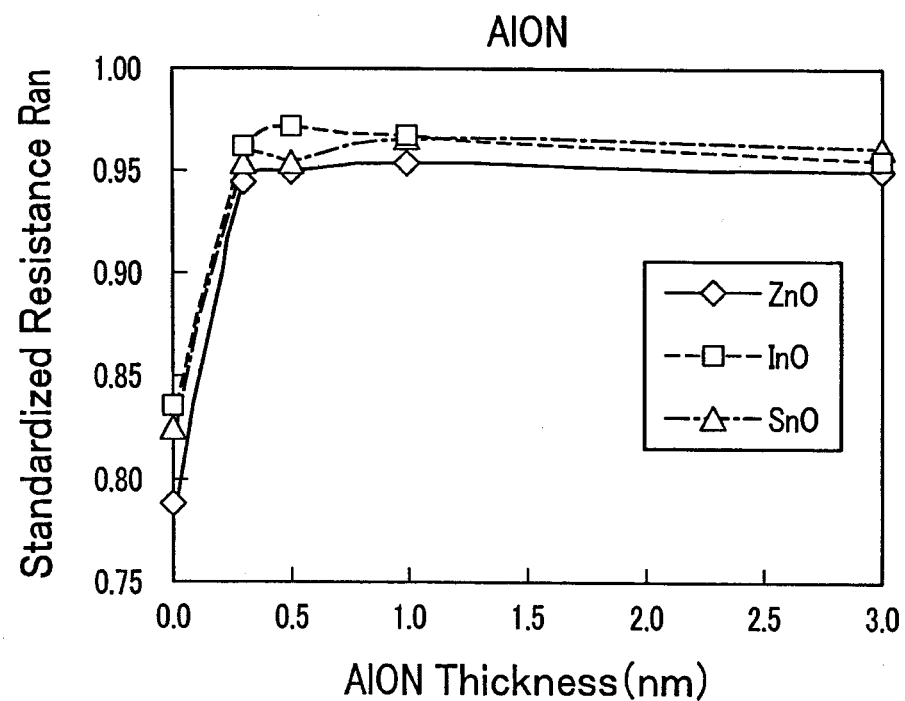
FIG. 23 is a graph indicative of the dependency of the thickness of AlON on resistance changes.

The results of experimentation where the interface protective layer 105 was made of AlON(N/(N+O)=10 at %) are plotted in the graph of FIG. 23, with the value of the standardized resistance Ran as ordinate and the thickness in nm of AlON—the interface protective layer 105—as abscissa. The respective parameters are ZnO, $In_2O_3$, and $SnO_2$ as the semiconductor oxide layer 142.

Experiment III-3

Figure 24:
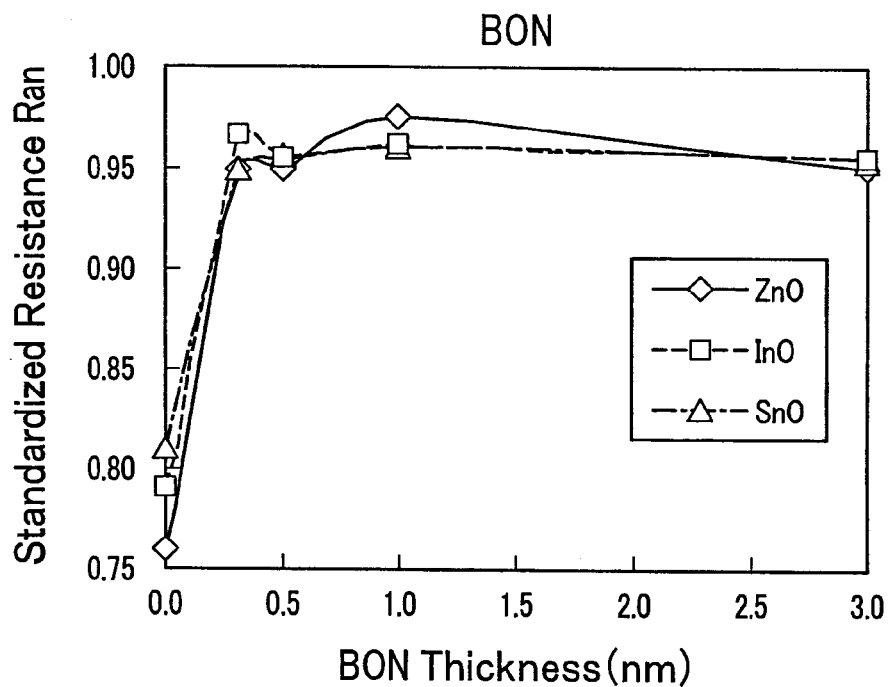
FIG. 24 is a graph indicative of the dependency of the thickness of BON on resistance changes.

The results of experimentation where the interface protective layer 105 was made of BON(N/(N+O)=10 at %) are plotted in the graph of FIG. 24, with the value of the standardized resistance Ran as ordinate and the thickness in nm of BON—the interface protective layer 105—as abscissa. The respective parameters are ZnO, $In_2O_3$, and $SnO_2$ as the semiconductor oxide layer 142.

As can be seen from the results of the graphs of FIGS. 22 to 24, the thickness of the interface protective layer 105 has to be 0.3 nm or greater.

Experiment IV

Experimentation was conducted while the spacer layer 140 consisting of three layers in Experimental Example I was changed to the spacer layer 140 consisting only of the single semiconductor oxide layer 142.

That is to say, a CPP-GMR device unit having the spacer layer 140 consisting solely of the semiconductor oxide layer 142, shown in Table 2 given below, was provided by sputtering it on the lower electrode layer 3 made of NiFe.

TABLE 2

| Multilayer Structure | | Layer Material | Thickness (nm) |
|---|---|---|---|
| Protective Layer (126) | | Ru | 2.0 |
| Free Layer (150) | | CoFe | 4.0 |
| Spacer Layer (140) | Semiconductor Oxide Layer (142) | ZnO | 1.6 |
| Fixed Magnetization Layer (130) | Inner Layer (133) | CoFe | 3.5 |
| | Nonmagnetic Intermediate Layer (132) | Ru | 0.7 |
| | Outer Layer (131) | CoFe | 3.0 |
| Antiferromagnetic Layer (122) | | IrMn | 5.0 |
| Underlay Layer (121) | | NiCr | 4.0 |

For the preparation of specific samples, the device unit in Table 2 was formed, followed by heat treatment at 270° C. for 3 hours, by which the semiconductor oxide layer 142—ZnO—was crystallized to lower its resistance.

Then, the aforesaid device unit was processed into a columnar shape of 100×100 nm, and the interface protective layer 105 that contained a nitrogen element and had a thickness of 3 nm—SiON—was formed on its side, after which the insulating layer 104 made of $Al_2O_3$ was covered over the interface protective layer 105 at a thickness of about 30 nm to make sure its insulating function. Finally, the upper electrode layer 5 made of NiFe was formed on the device, thereby preparing the CPP-GMR device sample 500.

Samples were prepared at varied nitrogen concentrations (at % in the anions).

Each of the thus prepared samples was measured for the standardized resistance Ran.

For the CPP-GMR devices obtained by using ZnO as the semiconductor oxide layer 142, and SiON as the interface protective layer 105, how the value of Ran changed was measured at varied nitrogen atom % of the interface protective layer 105—SiON. The results are plotted in the graph of FIG. 25, with the value of the standardized resistance Ran as ordinate and as abscissa the content (at %) of nitrogen atoms in the anions forming the interface protective layer 105 (i.e., N+O).

Figure 25:
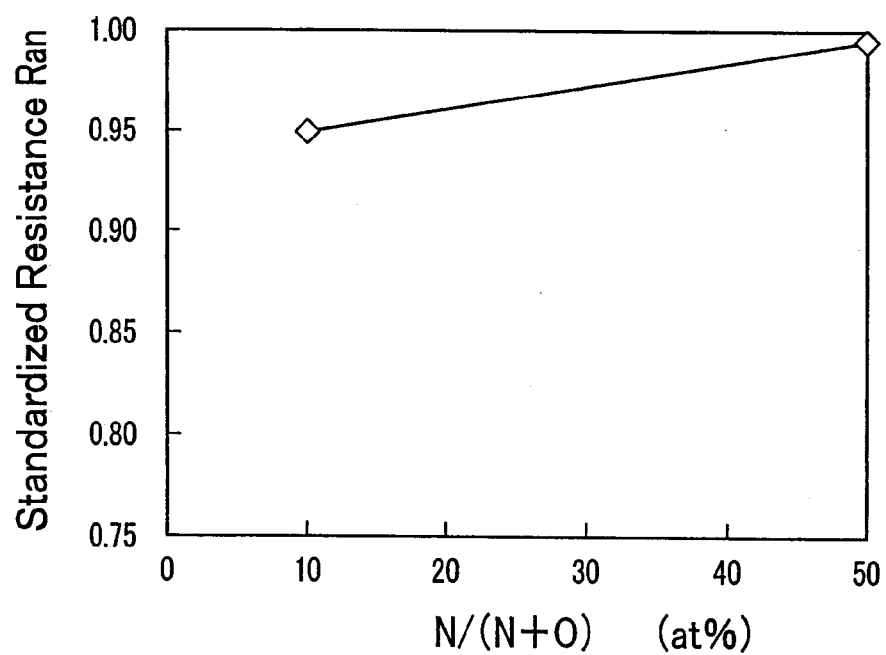
FIG. 25 is a graph indicative of the relationship between the standardized Ran and the content of nitrogen in the SiON interface protective layer after the heat treatment of a device sample comprising a spacer layer made only of a semiconductor oxide layer.

From the results plotted in the graph of FIG. 25, it is appreciated that if the content of nitrogen atoms in the anions forming the interface protective layer 105 is greater than 10 at %, there are resistance fluctuations of less than 5% obtained. Thus, if the resistance fluctuations are limited to within 5%, fluctuations of the device characteristics and deteriorations over time of them due to heat and stress in the process can then be well held back.

(Requirement that the Value of the Resistance Fluctuation Ran has to be Greater than 0.95)

The requirement that the value of the aforesaid resistance fluctuation Ran after annealing has to be greater than 0.95 (which means that the resistance fluctuation is within 5%) is determined from the following fact.

That is, for a device comprising the SiON interface protective layer 105 and the ZnO semiconductor oxide layer 142 as shown in FIG. 12, accelerated testing was carried out to make certain changes of output fluctuations over time. The testing was done under high-temperature and large current conditions: a temperature of 120% and an increased current of 6 mA. Under such conditions, if the output fluctuations over 100 hours are reduced to less than 10%, a three-year warranty period will be given to the performance of products (standardized output>0.90).

Figure 26:
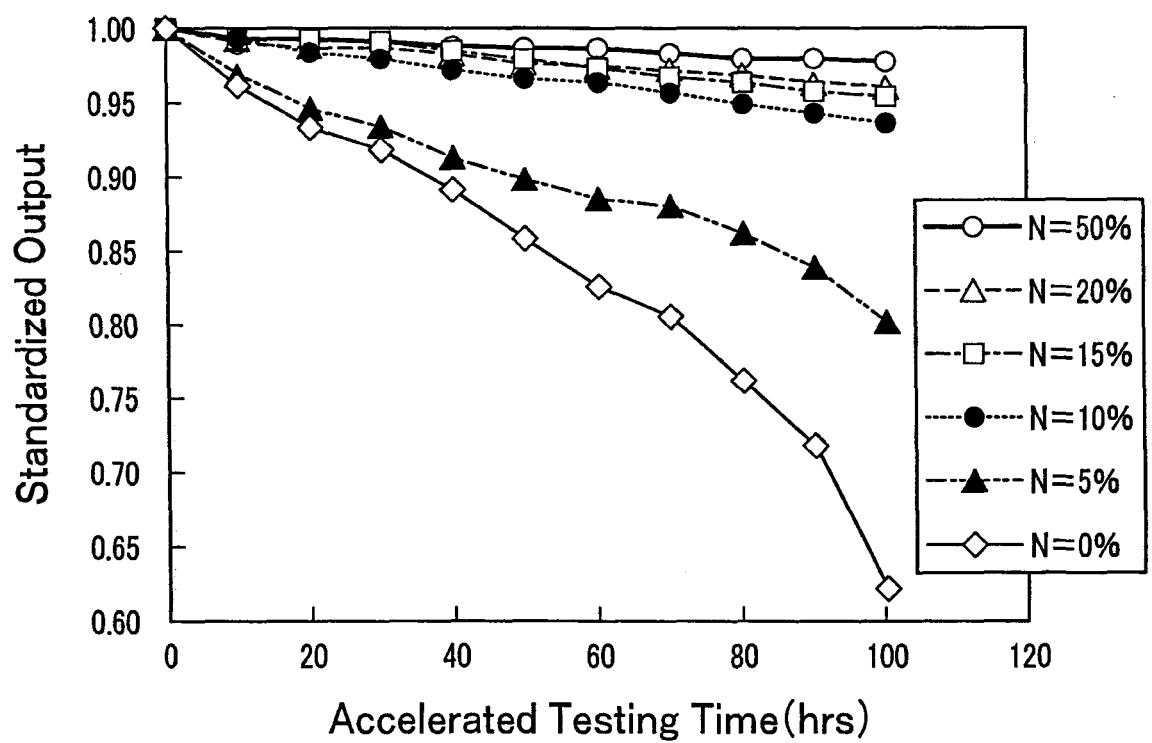
FIG. 26 is a graph indicative of changes over time of output fluctuations at the time of accelerated testing.

Changes over time of the output fluctuations upon the accelerated testing are plotted in the graph of FIG. 26 with the standardized output as ordinate and accelerated testing time (Hrs) as abscissa, and with the parameter being the content of N (at %) in the SiON interface protective layer 105.

The conclusion is that in the device comprising the interface protective layer 105 where N=5 at % indicating that the resistance fluctuations after annealing are greater than 5%, and the interface protective layer 105 where N=0 at %, respectively, there were output fluctuations of greater than 10% obtained. From this, it is appreciated that the value of the resistance fluctuations Ran after annealing must be reduced to within 5%.

From the results of the aforesaid experiments, the advantages of the invention would be undisputed. That is, the invention provides a giant magneto-resistive effect device of the CPP (current perpendicular to plane) structure (CPP-GMR device) comprising a spacer layer, and a first ferromagnetic layer and a second ferromagnetic layer stacked together with said spacer layer sandwiched between them, with a sense current passed in the stacking direction, wherein the first ferromagnetic layer and the second ferromagnetic layer function such that the angle made between the directions of magnetizations of both layers change relatively depending on an external magnetic field, said spacer layer contains a semiconductor oxide layer, and an interface protective layer containing a nitrogen element is provided at a position where the semiconductor oxide layer forming the whole or a part of said spacer layer contacts the insulating layer 104. Thus, there is a nitride of high covalent bonding capability formed at the surface of junction between the semiconductor oxide layer 142 and the interface protective layer 105, so that the migration of oxygen from the semiconductor oxide layer to the side of the insulating layer 104 is inhibited; even when the device is exposed to heat and stress in the process, fluctuations and deteriorations of device characteristics are held back.

Referring here to possible applications to the industry, the present invention could find use in the industry of a magnetic disk system comprising a magneto-resistive effect device adapted to read the magnetic field strength of a magnetic recording medium or the like in the form of signals.

What we claim is:

1. A giant magneto-resistive effect device (CPP-GMR device) having a CPP (current perpendicular to plane) structure comprising:
   a first ferromagnetic layer;
   a spacer layer; and
   a second ferromagnetic layer,
   wherein:
   (A) the first and second ferromagnetic layer are stacked together with the spacer layer sandwiched between them, with a sense current applied in a stacking direction;
   (B) the first ferromagnetic layer and the second ferromagnetic layer function such that an angle made between directions of magnetizations of both layers changes relatively depending on an external magnetic field;
the spacer layer comprises:
a first nonmagnetic metal layer;
a semiconductor oxide layer made of ZnO; and
a second nonmagnetic metal layer,
wherein the first and second nonmagnetic metal layer are each made of a nonmagnetic metal material, and
the semiconductor oxide layer is interposed between the first and second nonmagnetic metal layer;
(C) at a position where the semiconductor oxide layer forming a part of the spacer layer contacts an insulating layer, there is a nitrogen element-containing interface protective layer interposed between the semiconductor layer and the insulating layer;
(D) the nitrogen element-containing interface protective layer is at least one selected from the group consisting of SiN, SiON, AlON, BN, and BON;
(E) a content of nitrogen atoms in anions forming the nitrogen element-containing interface protective layer is greater than 10 at %;
(F) the nitrogen element-containing interface protective layer has a thickness of at least 0.3 nm; and
(G) ZnN is formed at an interface between the semiconductor oxide layer and the nitrogen element-containing interface protective layer.

2. The magneto-resistive effect device according to claim 1, wherein the semiconductor oxide layer forming the spacer layer has a thickness of 0.3 to 5 nm.

3. The magneto-resistive effect device according to claim 1, wherein said first and second nonmagnetic metal layers are each at least one selected from the group consisting of Cu, Zn, Au, and Ag.

4. The magneto-resistive effect device according to claim 1, wherein said first and second nonmagnetic metal layers have each a thickness of 0.3 to 2.0 nm.

5. A thin-film magnetic head, comprising:
a plane opposite to a recoding medium,
the magneto-resistive effect device as recited in claim 1, which is located near the plane opposite to the recoding medium for detecting a signal magnetic field from the recording medium, and
a pair of electrodes for passing a current in the stacking direction of the magneto-resistive effect device.

6. A head gimbal assembly, comprising:
a slider including the thin-film magnetic head as recited in claim 5 and located in opposition to the recording medium, and
a suspension adapted to resiliently support the slider.

7. A magnetic disk system, comprising:
a slider including the thin-film magnetic head as recited in claim 5 and located in opposition to the recording medium, and
a positioning means adapted to support and position the slider with respect to the recording medium.

8. The magneto-resistive effect device according to claim 1, wherein the content of nitrogen atoms in anions forming the nitrogen element-containing interface protective layer is greater than 10 to 20 at %.

9. The magneto-resistive effect device according to claim 1, wherein the nitrogen element-containing interface protective layer comprises SiN.

10. The magneto-resistive effect device according to claim 1, wherein the nitrogen element-containing interface protective layer comprises SiON.

11. The magneto-resistive effect device according to claim 1, wherein the nitrogen element-containing interface protective layer comprises AlON.

12. The magneto-resistive effect device according to claim 1, wherein the nitrogen element-containing interface protective layer comprises BN.

13. The magneto-resistive effect device according to claim 1, wherein the nitrogen element-containing interface protective layer comprises BON.

* * * * *